(12) United States Patent
Lin et al.

(10) Patent No.: US 12,506,071 B2
(45) Date of Patent: Dec. 23, 2025

(54) SEMICONDUCTOR MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Bo-Feng Young, Hsinchu (TW); Han-Jong Chia, Hsinchu (TW); Sai-Hooi Yeong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 670 days.

(21) Appl. No.: 17/577,996

(22) Filed: Jan. 18, 2022

(65) Prior Publication Data
US 2023/0230921 A1    Jul. 20, 2023

(51) Int. Cl.
| | |
|---|---|
| H01L 23/528 | (2006.01) |
| H10B 41/10 | (2023.01) |
| H10B 41/27 | (2023.01) |
| H10B 41/35 | (2023.01) |
| H10B 43/10 | (2023.01) |
| H10B 43/27 | (2023.01) |
| H10B 43/35 | (2023.01) |
| H10B 51/10 | (2023.01) |
| H10B 51/20 | (2023.01) |
| H10B 51/30 | (2023.01) |
| H10D 30/01 | (2025.01) |
| H10D 30/67 | (2025.01) |

(52) U.S. Cl.
CPC ......... *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 51/10* (2023.02); *H10B 51/20* (2023.02); *H10B 51/30* (2023.02); *H10D 30/031* (2025.01); *H10D 30/6713* (2025.01); *H10D 30/6729* (2025.01)

(58) Field of Classification Search
CPC ........... H01L 23/5283; H01L 29/41733; H01L 29/66742; H01L 29/78618; H10B 43/35; H10B 43/10; H10B 41/27; H10B 43/27; H10B 51/30
See application file for complete search history.

(56) References Cited

U.S. PATENT DOCUMENTS

| | | | | |
|---|---|---|---|---|
| 2020/0176468 A1* | 6/2020 | Herner | ............... | H10D 30/0413 |
| 2021/0066348 A1* | 3/2021 | Prasad | ................ | H10D 64/689 |
| 2021/0407845 A1* | 12/2021 | Wang | .................... | H10B 51/10 |

* cited by examiner

*Primary Examiner* — Christine A Enad
(74) *Attorney, Agent, or Firm* — Birch, Stewart, Kolasch & Birch, LLP

(57) ABSTRACT

A semiconductor device includes a semiconductor substrate, first and second stack units disposed over the semiconductor substrate, and a feature disposed between the first and second stack units. Each of the first and second stack units includes at least one stack that includes a conductive film and a dielectric film stacked on each other. The feature includes a plurality of repeating units and a plurality of separators disposed to alternate with the repeating units. Each of the repeating units includes an inner portion including a pair of conductive pillars, and an outer portion including a memory film and a channel film. A method for manufacturing the semiconductor device is also disclosed.

20 Claims, 24 Drawing Sheets

SEMICONDUCTOR MEMORY DEVICE AND METHOD FOR MANUFACTURING THE SAME

BACKGROUND

Semiconductor memory devices are widely used in computers, portable devices, automotive parts, and internet of things (IoT), etc. With increasing requirement of semiconductor memory devices with high memory capacity, in addition to scale down memory cells, a memory array tends to be developed to have a three-dimensional (3D) architecture instead of a two-dimensional (2D) architecture, so that the memory capacity of the semiconductor memory device can be effectively increased with a relatively small area penalty. Nevertheless, a memory array with a 3D architecture has a relatively complicated circuit, and is relatively difficult to be manufactured. Hence, there is continuous demand to develop 3D semiconductor memory devices with less defects (e.g., word line open, and pattern fail, etc.), and a method for making thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
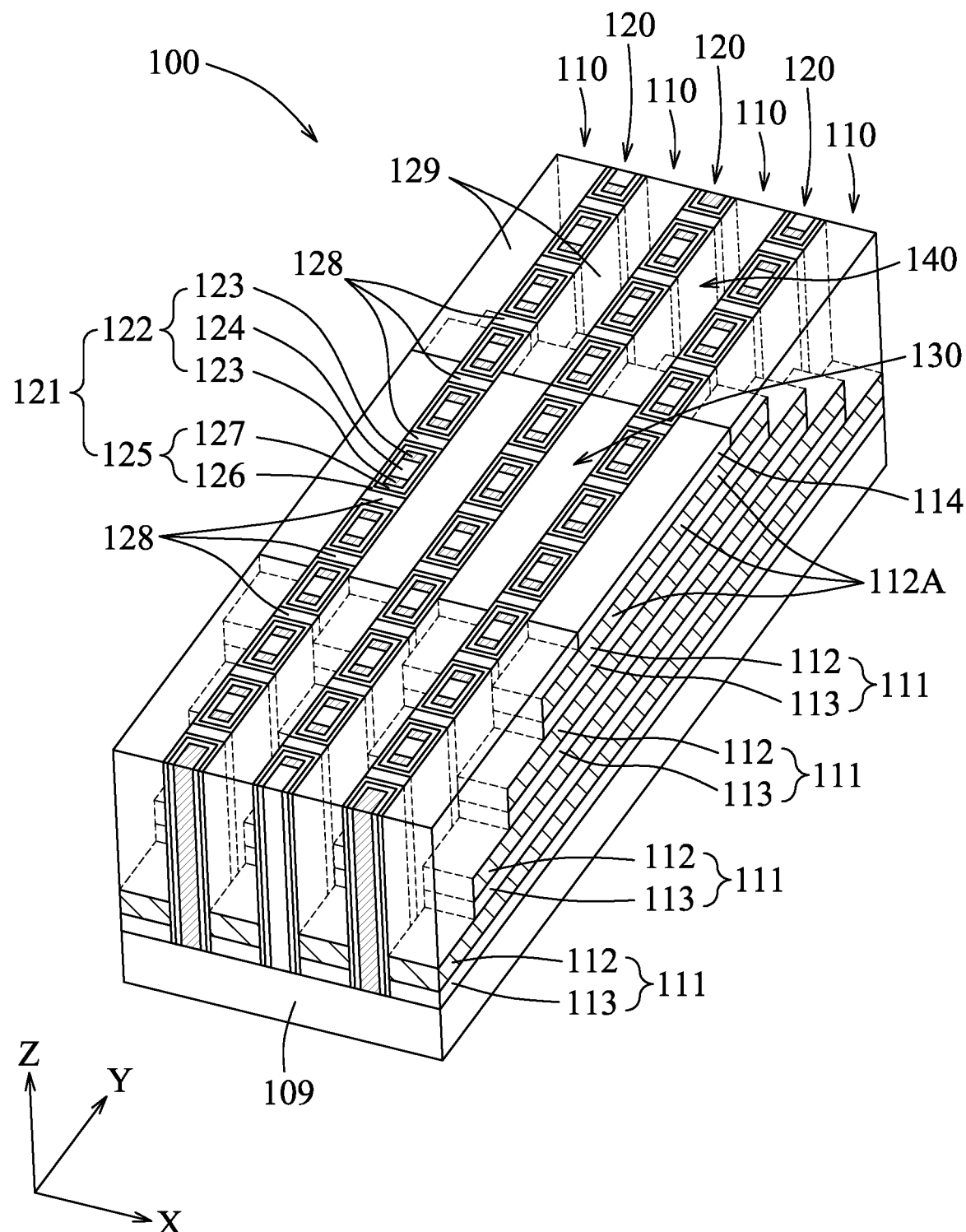
FIG. 1 illustrates a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device and methods for manufacturing the same. FIG. 1 illustrates a semiconductor device 100 in accordance with some embodiments, and FIGS. 2 and 3 respectively illustrate partial enlarged top views of the semiconductor device 100 in accordance with some embodiments. The semiconductor device 100 includes a plurality of thin film transistors 101 arranged in three dimensions (for example, X, Y, and Z directions) which are transverse to one another. In some embodiments, the three directions are perpendicular to one another. In some embodiments, the semiconductor device 100 is located in the back-end of line (BEOL), while in certain embodiments, the semiconductor device 100 may be located in the front-end of line (FEOL). In some embodiments, the semiconductor device 100 including the thin film transistors 101 arranged in the three dimensions is referred to as a three-dimensional (3D) memory device, for example, a 3D NOR flash device. Other suitable memory devices are within the contemplated scope of the disclosure.

The semiconductor device 100 includes a semiconductor substrate 109, a plurality of stack units 110, and a plurality of features 120 disposed to alternate with the stack units 110.

In some embodiments, the semiconductor substrate 109 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 109 may be doped with p-type impurities or n-type impurities, or undoped. In addition, the semiconductor substrate 109 may be a bulk silicon substrate, a silicon-on-insulator (SOI) substrate, or a germanium-on-insulator (GOI) substrate. Other suitable materials for the semiconductor substrate 109 are within the contemplated scope of disclosure. In some embodiments, a peripheral circuit (not shown) may be formed over the semiconductor substrate 109, and may include active devices (for example, transistors, or the like), passive devices (for example, capacitors, resistors, or the like), decoders, amplifiers, and combinations thereof. Other suitable peripheral circuits and routing for controlling the semiconductor device 100 are within the contemplated scope of disclosure.

The stack units 110 are disposed over the semiconductor substrate 109 and are spaced apart from one another. In some embodiments, the stack units 110 are displaced from one another in the X direction. In some embodiments, each of the stack units 110 includes at least one stack 111. The stack 111 includes a conductive film 112 and a dielectric film 113 which are stacked on each other in the Z direction. In some embodiments, the conductive film 112 may be formed as a single layer structure or a multi-layered structure. In some embodiments, the conductive film 112 may include a conductive material, such as elemental metal, alloy of at least two elemental metals, and conductive metal compound. In some embodiments, the conductive film 112 may be made of aluminum (Al), titanium (Ti), cobalt (Co), silver (Ag), gold (Au), copper (Cu), nickel (Ni), chromium (Cr), hafnium (Hf), ruthenium (Ru), tungsten (W), platinum (Pt), or alloys thereof. In some embodiments, the conductive film 112 may be made of titanium nitride (TiN), tantalum nitride (TaN), or the like. Other suitable conductive materials for the conductive film 112 are within the contemplated scope of disclosure. In some embodiments, the dielectric film 113 may be made of a dielectric material, such as silicon oxide, doped or undoped silicate glass, silicon nitride, silicon oxynitride, dielectric metal oxide, and combinations thereof. Other suitable dielectric materials for the dielectric film 113 are within the contemplated scope of disclosure.

In some embodiments, each of the stack units 110 further includes an upper film 114 which may be made of a dielectric material which is similar to the dielectric materials for the dielectric film 113, and thus details of the possible materials for the upper film 114 are omitted for the sake of brevity. The upper film 114 is disposed on the at least one stack 111, such that the conductive film 112 is disposed between the upper film 114 and the dielectric film 113. In some embodiments, each of the stack units 110 is elongated in the Y direction, and the upper film 114 has a length shorter than that of the at least one stack 111 in the Y direction.

In some embodiments, each of the stack units 110 includes a plurality of the stacks 111 which are stacked on each other in the Z direction. In each of the stack units 110, the conductive films 112 of the stacks 111 are disposed to alternate with the dielectric films 113 of the stacks 111. In some embodiments, in each of the stack units 110, a distal one of the stacks 111 has a length in the Y direction shorter than that of a proximate one of the stacks 111 relative to the semiconductor substrate 109, so as to form a staircase configuration. In some embodiments, in each of the stacks 111, the conductive film 112 and the dielectric film 113 have the same length in the Y direction. In some embodiments, as shown in FIG. 1, the semiconductor device 100 may include four of the stacks 111 with the upper film 114 disposed thereon. In certain embodiments, the number of the stacks 111 in each of the stack units 110 can be varied according to the design for the memory size of the semiconductor device 100.

Each of the features 120 includes a plurality of repeating units 121 and a plurality of separators (struts) 128 which are disposed to alternate with the repeating units 121. In some embodiments, the separators 128, each being used for electrically isolating two adjacent ones of the repeating units 121, may be made of a dielectric material similar to the materials for the dielectric film 113, and thus details of the possible materials for the separators 128 are omitted for the sake of brevity. In some embodiments, each of the repeating units 121 includes an inner portion 122 and an outer portion 125 surrounding the inner portion 122 so as to separate the inner portion 122 from two adjacent ones of the stack units 110 and two adjacent ones of the separators 128. The inner portion 122 includes a pair of conductive pillars 123 which are separated from each other in the Y direction. In some embodiments, the conductive pillars 123 extend in a direction (for example, but not limited to, the Z direction) transverse to the elongated direction of the conductive films 112 of adjacent ones of the stacks 111. In some embodiments, the conductive pillars 123 may be made of a conductive material similar to the materials for the conductive film 112, and thus details of the possible materials for the conductive pillars 123 are omitted for the sake of brevity. In some embodiments, the inner portion 122 further includes an isolation region 124 disposed to separate the two conductive pillars 123. In some embodiments, the isolation region 124 for electrically isolating the two conductive pillars 123 may be made of a dielectric material similar to the materials for the separators 128, and thus possible materials for the isolation region 124 are omitted for the sake of brevity. In some embodiments, the outer portion 125 includes a memory film 126 and a channel film 127 which is disposed between the memory film 126 and the inner portion 122. In some embodiments, the memory film 126 may include a high dielectric constant dielectric material, such as hafnium oxide, aluminum oxide, or the like; a dielectric structure with high dielectric constant, such as ONO (oxide-nitride-oxide) stack and NON (nitride-oxide-nitride) stack; and a ferroelectric material, such as barium titanate ($BaTiO_3$), lead titanate ($PbTiO_3$), lead zirconate ($PbZrO_3$), lithium niobate ($LiNbO_3$), sodium niobate ($NaNbO_3$), potassium niobate ($KNbO_3$), potassium tantalite ($KTaO_3$), bismuth scandate ($BiScO_3$), bismuth ferrite ($BiFeO_3$), aluminum scandium nitride (AlScN), and hafnium oxide doped with yttrium (Y), lanthanum (La), gadolinium (Gd), erbium (Er), titanium (Ti), zirconium (Zr), aluminum (Al), or tantalum (Ta). Other suitable materials for the memory film 126 are within the contemplated scope of disclosure. In some embodiments, the memory film 126 may be formed as a single-layer film or may include a plurality of films made of different materials. In some embodiments, the channel film 127 may be made of a semiconductor material, such as doped or undoped polycrystalline silicon (p-Si), doped or undoped amorphous silicon (a-Si), and oxide semiconductor including indium zinc oxide (IZO), indium gallium zinc oxide (IGZO), indium tungsten oxide (IWO), indium tin oxide (ITO), zinc oxide (ZnO), or the like. Other suitable semiconductor materials for the channel film 127 are within the contemplated scope of disclosure. In some embodiments, as shown in FIG. 1, each of the features 120 may include nine of the repeating units 121. In certain embodiments, the number of the repeating units 121 in each of the features 120 may be varied according to the design for the memory size (or memory density) of the semiconductor device 100.

Figure 2:
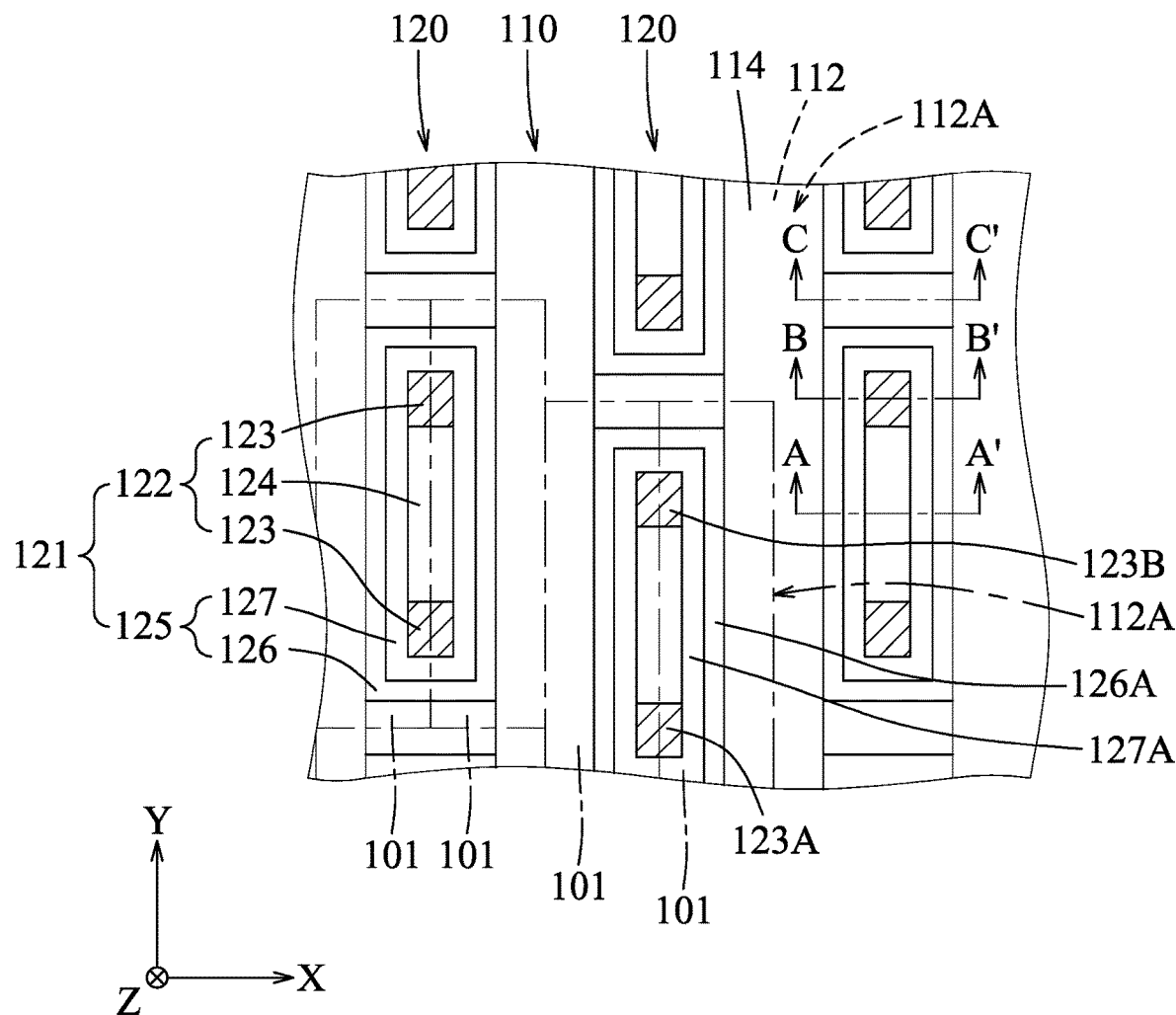
FIG. 2 illustrates a partial enlarged top view of the semiconductor device in accordance with some embodiments.
Figure 3:
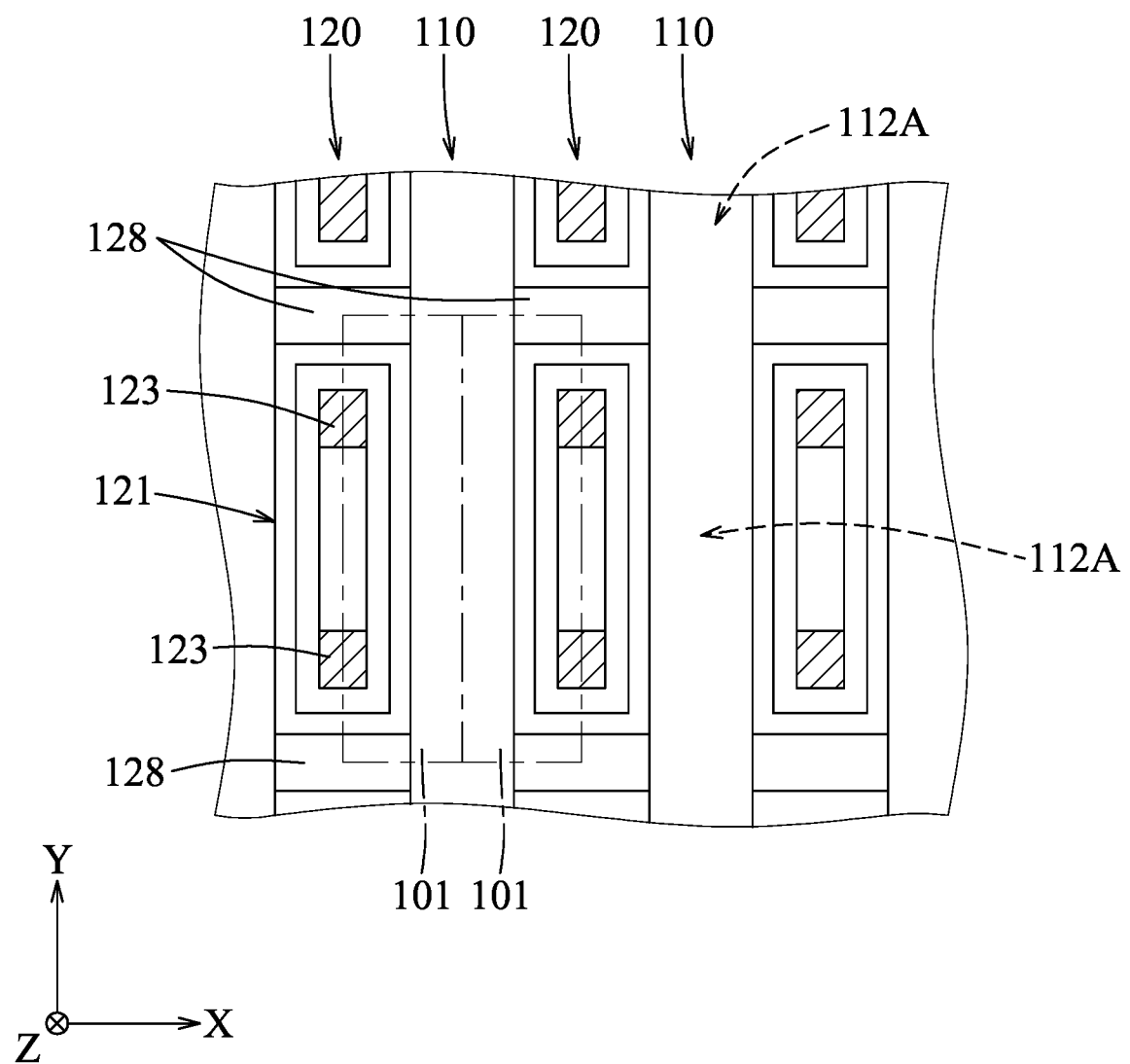
FIG. 3 illustrates a partial enlarged top view of the semiconductor device in accordance with some embodiments.

In some embodiments, the conductive pillars 123 of the repeating units 121 in one of the features 120 may be respectively staggered from the conductive pillars 123 of the repeating units 121 in an adjacent one of the features 120, as shown in FIG. 2. In other embodiments, the conductive pillars 123 of the repeating units 121 in one of the features 120 may be respectively in alignment with the conductive pillars 123 of the repeating units 121 in an adjacent one of the features 120, as shown in FIG. 3.

In some embodiments, the semiconductor device 100 includes a memory segment 130 and a staircase segment 140 aside the memory segment 130. In each of the stack units 110, each of the stacks 111 has a main part disposed beneath the upper film 114 and a lateral part extending beyond the upper film 114. Each of the stack units 110 further includes an inter-metal dielectric (IMD) part 129 which is formed over the lateral parts of the stacks 111. In some embodiments, the IMD parts 129 of the stack units 110 may be flush with the upper film 114. The upper film 114 and the main parts of the stacks 111 constitute a main portion of the stack unit 110, and the lateral parts of the stacks 111 and the IMD part 129 constitute a lateral portion of the stack unit 110. Each of the features 120 has a main portion disposed between two adjacent ones of the main portions of the stack units 110, and a lateral portion disposed between two adjacent ones of the lateral portions of the stack units 110. The main portions of the stack units 110 and the main portions of the features 120 constitute the memory segment 130, and the lateral portions of the features 120 and the lateral portions of the stack units 110 constitute the staircase segment 140. In the memory segment 130, the thin film transistors 101 are regularly arranged in all of the three dimensions, while the thin film transistors 101 in the staircase segment 140 are not evenly distributed in the three dimensions. For example, as shown in FIG. 1, the memory segment 130 is illustrated with a 6×3×4 memory cell array.

Figure 4:
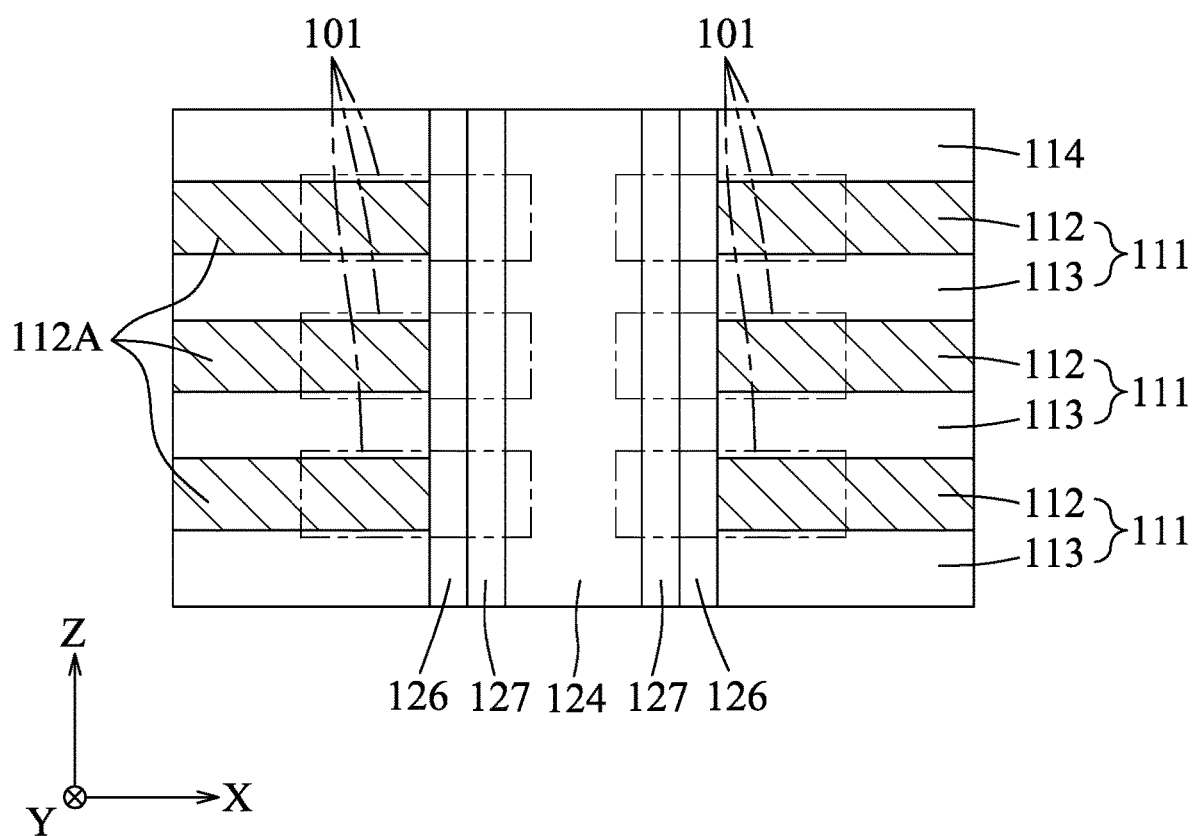
FIG. 4 illustrates a sectional view taken along line A-A' of FIG. 2.
Figure 5:
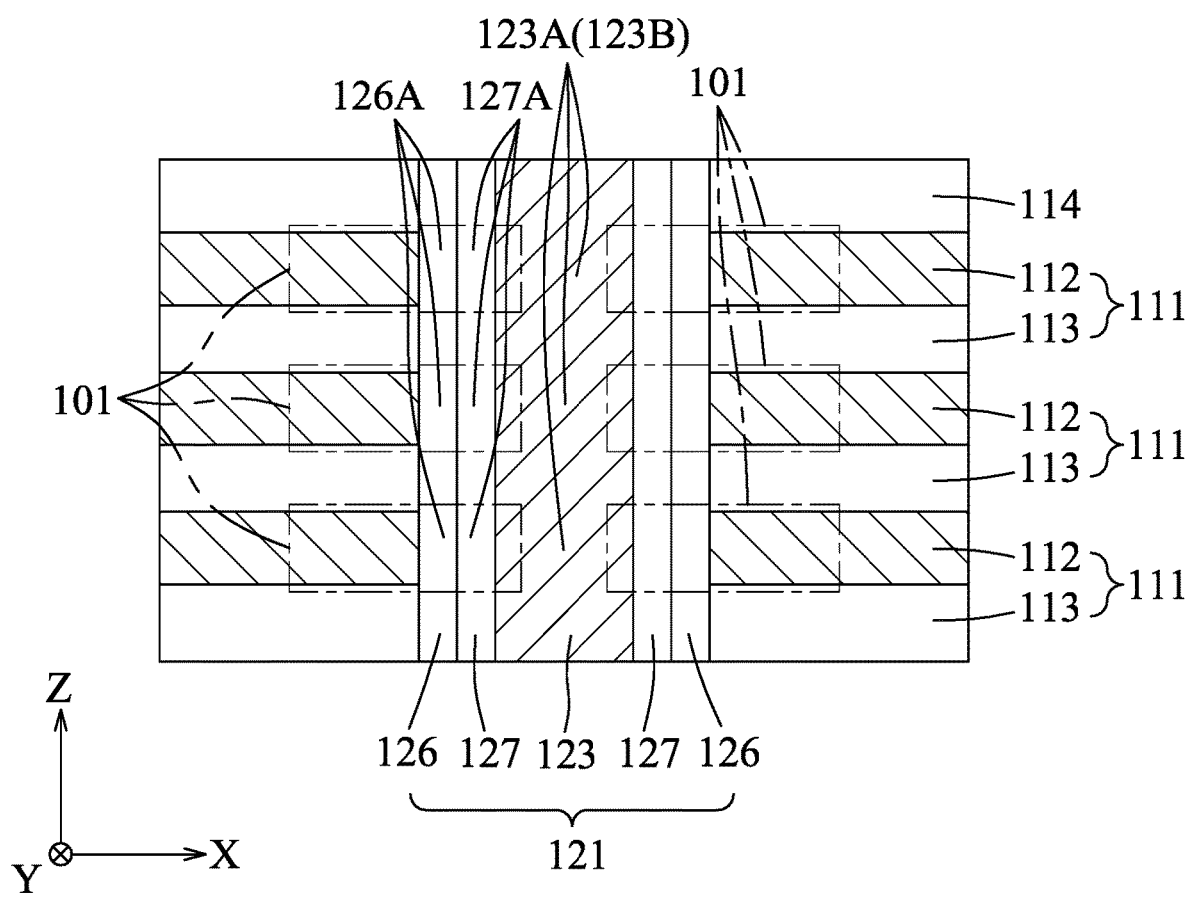
FIG. 5 illustrates a sectional view taken along line B-B' of FIG. 2.
Figure 6:
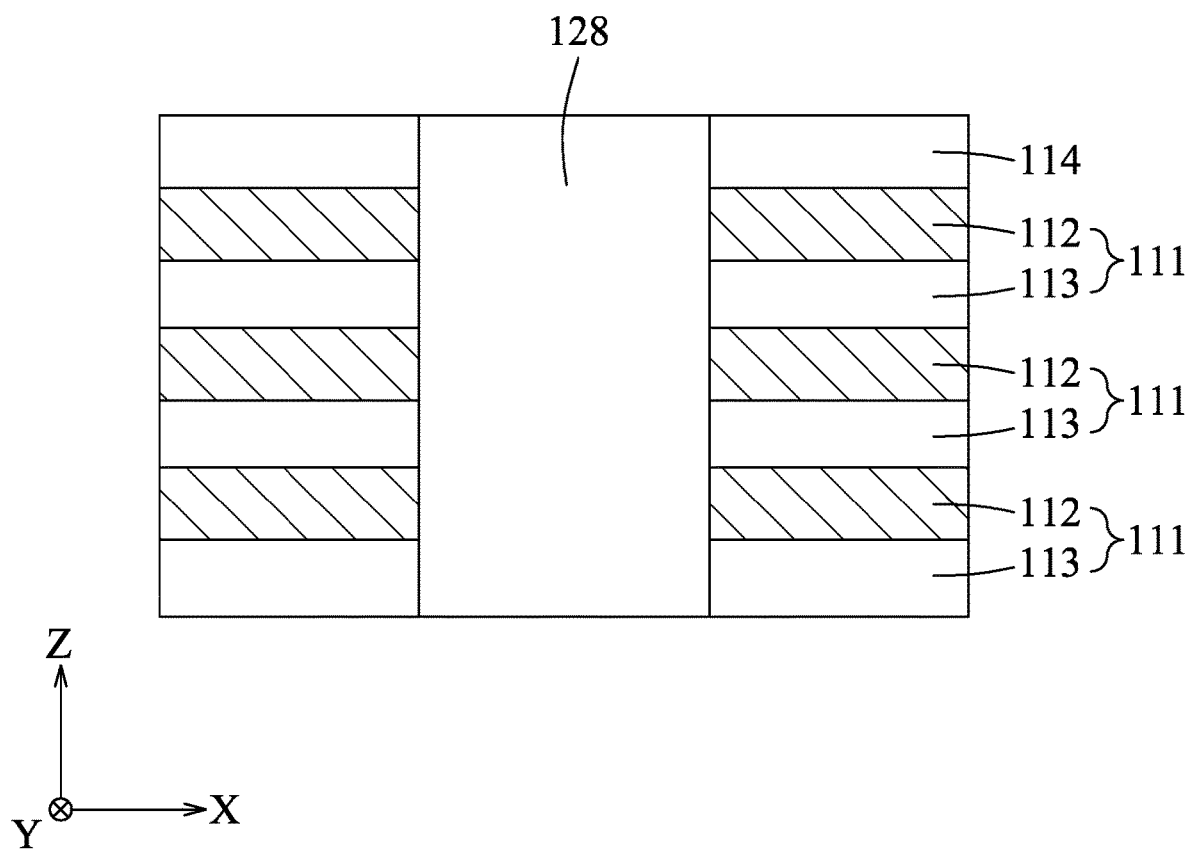
FIG. 6 illustrates a sectional view taken along line C-C' of FIG. 2.

FIGS. 4 to 6 illustrate sectional views of the thin film transistors 101 taken along line A-A', line B-B' and line C-C' of FIG. 2, respectively. In some embodiments, each of the conductive films 112 serves as a word line, and the conductive pillars 123 of each of the repeating units 121 serve as a bit line and a source line, respectively. The word line has a plurality of word line portions 112A which are displaced from one another in the Y direction, as shown in FIGS. 1 to 3. Each of the word line portions 112A serves as a gate electrode of a corresponding one of the thin film transistors 101. The source line has a plurality of source line portions 123A which are displaced from one another in the Z direction, as shown in FIG. 5. Each of the source line portions 123A serves as a first source/drain electrode of a corresponding one of the thin film transistors 101. The bit line has a plurality of bit line portions 123B which are displaced from one another in the Z direction, as shown in FIG. 5. Each of the bit line portions 123B serves as a second source/drain electrode of a corresponding one of the thin film transistors 101. The channel film 127 of each of the repeating units 121 has a plurality of channel regions 127A, each of which is located among a corresponding one of the word line portions 112A (i.e., the gate electrode), a corresponding one of the source line portions 123A (i.e., the first source/drain electrode) and a corresponding one of the bit line portions 123B (i.e., the second source/drain electrode), and serves as a channel of a corresponding one of the thin film transistors 101, as shown in FIG. 2. The memory film 126 of each of the repeating units 121 has a plurality of memory regions 126A, each of which serves as a gate dielectric to electrically isolate a corresponding one of the word line portions 112A (i.e., the gate electrode) from a corresponding one of the channel regions 127A (i.e., the channel) in a corresponding one of the thin film transistors 101, as shown in FIG. 2. Because two adjacent ones of the repeating units 121 are separated from each other by the separator 128 therebetween (see FIGS. 1 and 2), a current from the thin film transistors 101 defined by one of the repeating units 121 is less likely to leak to the thin film transistors 101 defined by the other one of the repeating units 121. Each of the thin film transistors 101 includes a gate electrode (i.e., word line portion 112A), a first source/drain electrode (i.e., source line portion 123A), a second source/drain electrode (i.e., bit line portion 123B), a channel (i.e., channel region 127A), and a gate dielectric (i.e., memory region 126A). The first and second source/drain electrodes are located at opposite sides of the channel, and the gate electrode is separated from the channel by the gate dielectric. As shown in FIGS. 1 to 3, two adjacent thin film transistors 101 formed at two opposite sides of the word line portion 112A and at the same X-Y plane can share the same word line portion 112A. As shown in FIG. 5, two adjacent thin film transistors 101 formed at two opposite sides of the source line portion 123A (and the bit line portion 123B) and at the same X-Y plane can share the same source line portion 123A (and the bit line portion 123B). In some embodiments, the gate dielectric is made of a ferroelectric material, and the thin film transistor 101 may serve as a memory cell which is able to store one bit of binary information through different orientations (e.g., "up" or "down" polarization) of dipole moment of the ferroelectric material.

During a writing operation, a memory region 126A of a thin film transistor 101 can be switched to one of a first polarization state and a second polarization state by applying suitable programming voltages to a corresponding word line, and a source line and a bit line of a corresponding repeating unit 121. The thin film transistor 101 has different threshold voltages at the first and second polarization states, thereby storing different digital values (e.g., 0 or 1) therein. For example, the thin film transistor 101 has a relatively low threshold voltage (low VT) at the first polarization state, and a relatively high threshold voltage (high VT) at the second polarization state. The polarization state of the memory region 126A, which remains after removal of the programming voltages, can be detected by measuring a current passing through a channel region 127A of the thin film transistor 101 after applying a suitable reading voltage. It should be noted that, the reading voltage has a value between the low VT and the high VT, and will not vary the polarization state of the memory region 126A of the thin film transistor 101. For example, a higher current will be detected when the memory region 126A is at the first polarization state, and a lower current will be detected when the memory region 126A is at the second polarization state.

Figure 7:
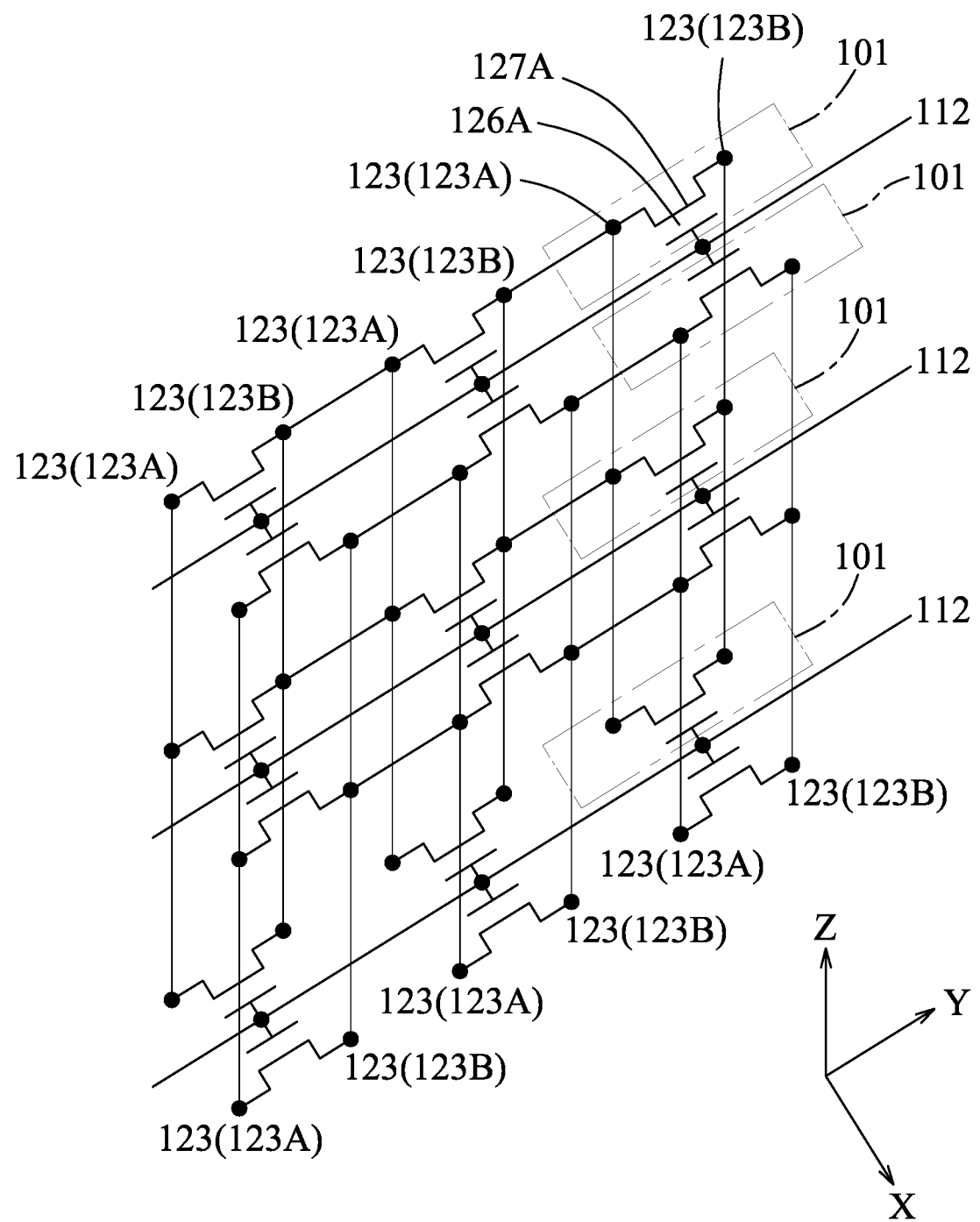
FIG. 7 is a schematic view illustrating a simplified equivalent circuit diagram of a memory segment of the semiconductor device in accordance with some embodiments.

FIG. 7 is a schematic view illustrating a simplified equivalent circuit diagram of the memory segment 130 of the semiconductor device 100 (see FIG. 1) in accordance with some embodiments. In some embodiments, the thin film transistors 101 may be configured as a 3D NOR flash. In some embodiments, each of the thin film transistor 101 may be considered as a memory cell, and hence, the memory cell may be referred to as a 1T FeRAM (FeFET).

As shown in FIG. 7, three of the conductive films 112 (i.e., word lines) are stacked on each other in the Z direction and extend in the Y direction, and the thin film transistors 101 coupled thereto are illustrated for simplicity of explanation. In the same X-Y plane, six thin film transistors 101 at two opposite sides of a word line 112 can share the same word line 112. In some embodiments, the source line portions 123A and the bit line portions 123B of the six thin film transistors 101 may respectively belong to twelve different conductive pillars 123 (i.e., source and bit lines), and thus, the six thin film transistors 101 may be separately accessed and controlled. In addition, three thin film transistors 101 defined by the same repeating unit 121 (see FIGS. 1 and 5) and displaced from one another in the Z direction can share the same source line (or bit line) 123, and may be separately accessed and controlled because the three thin film transistors 101 have different word lines 112.

In some alternative embodiments, the semiconductor device 100 may further include additional features, and/or some features present in the semiconductor device 100 may be modified, replaced, or eliminated without departure from the spirit and scope of the present disclosure.

With the provision of the staircase configuration of the stack unit 110, the word lines 112 in the semiconductor device 100 can be electrically connected to a peripheral circuit (for example, the transistors in the semiconductor substrate 109 shown in FIG. 1). The staircase configuration may be formed before forming the repeating units 121 (a staircase-first process) or after the forming the repeating units 121 (a staircase-last process). In the following, the staircase-first process is used for manufacturing the semiconductor device 100, although in some alternative embodiments, the staircase-last process may be used for manufacturing the semiconductor device 100.

Figure 8:
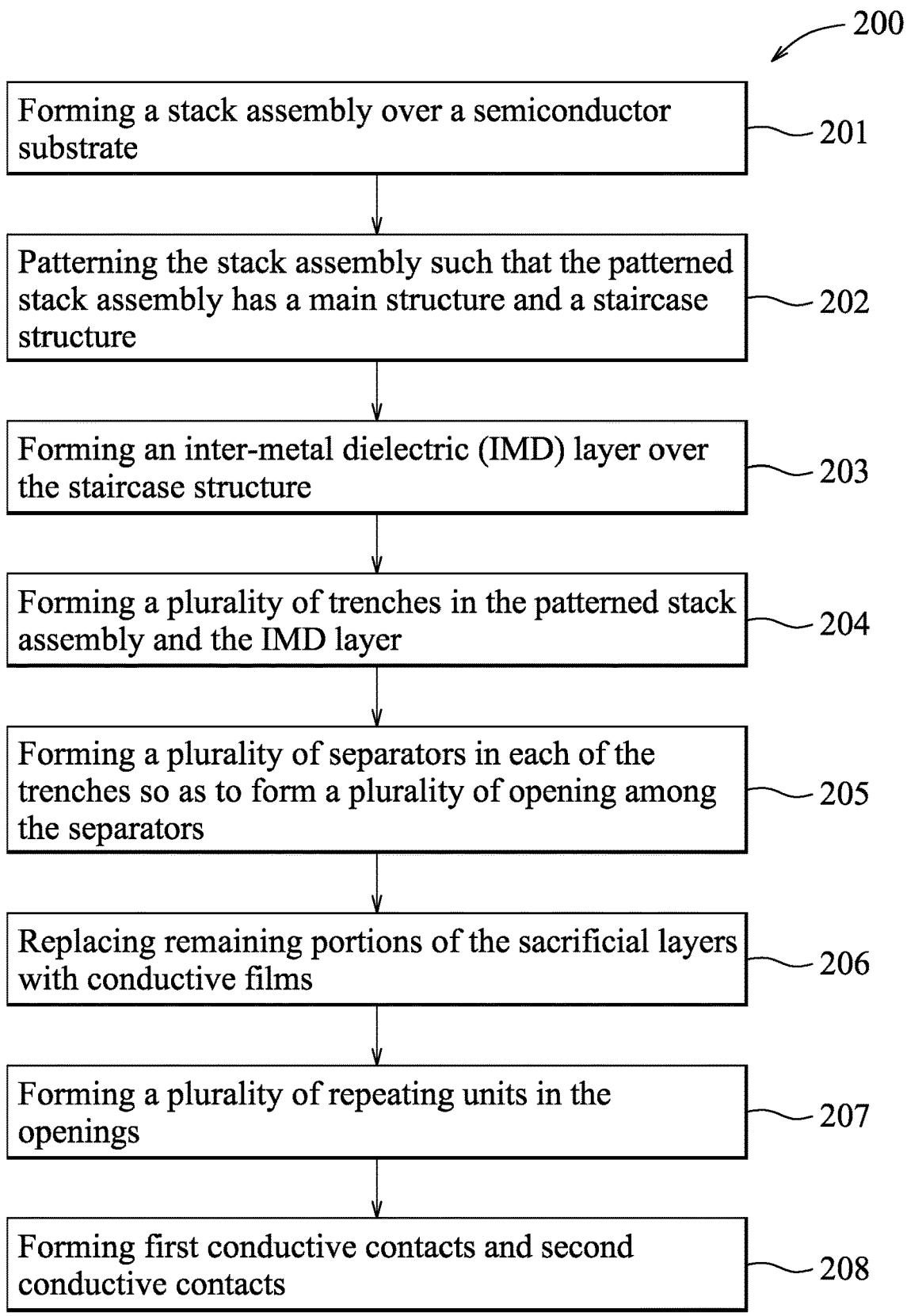
FIG. 8 is a flow diagram illustrating a method for manufacturing the semiconductor device in accordance with some embodiments.

FIG. 8 is a flow diagram illustrating a method 200 for manufacturing a semiconductor device, for example, but not limited to, the semiconductor device 100, as shown in FIG. 1, in accordance with some embodiments. FIGS. 9 to 18 illustrate schematic views of the intermediate stages of the method 200. Similar numerals from the above-mentioned embodiments have been used where appropriate, with some construction differences being indicated with different numerals.

Figure 9:
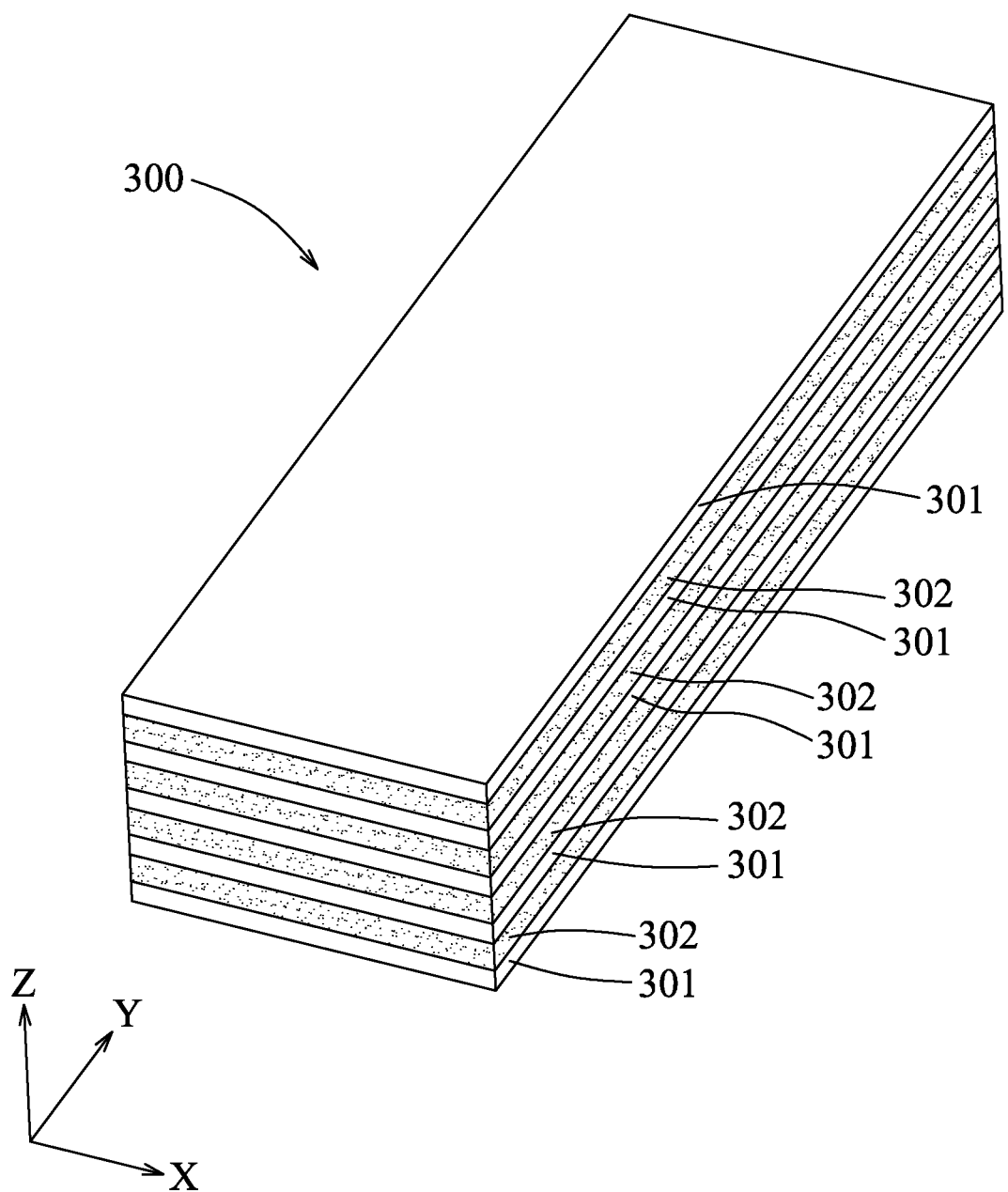
FIGS. 9 to 18 are schematic views illustrating intermediate stages of the method as depicted in FIG. 8 in accordance with some embodiments.

Referring to FIGS. 8 and 9, the method 200 begins at step 201, where a stack assembly 300 is formed over the semiconductor substrate 109 (see FIG. 1). For purposes of simplicity and clarity, the semiconductor substrate 109 is omitted in FIGS. 9 to 18. The stack assembly 300 includes a plurality of dielectric layers 301 and a plurality of sacrificial layers 302 which are disposed to alternate with the dielectric layers 301. In some embodiments, the stack assembly 300 further includes an uppermost one of the dielectric layers 301 disposed over all of the sacrificial layers 302. In some embodiments, the uppermost one of the dielectric layers 301 may have a thickness greater than that of remaining one of the dielectric layers 301 by about 1.2 to 2 times, so as to protect layers therebeneath from being damaged in subsequent processes. Although the stack assembly 300 exemplified in FIG. 9 illustrates five of the dielectric layers 301 and four of the sacrificial layers 302, in other embodiments, the number of the dielectric layers 301 and the sacrificial layers 302 may be more or less based on memory size in actual practice. In some embodiments, the dielectric layers 301 may be made of a first dielectric material similar to the materials for the dielectric films 113 described above, and thus details of the possible materials for the dielectric layers 301 are omitted for the sake of brevity. In some embodiments, the sacrificial layers 302 may be made of a second dielectric material which is different from the first dielectric material of the dielectric layers 301, and which can be selectively removed with respect to the first dielectric material of the dielectric layers 301. The second dielectric material for the sacrificial layers 302 may be selected from a dielectric material, such as silicon oxide, doped or undoped silicate glass, silicon nitride, silicon oxynitride, dielectric metal oxide, and combinations thereof. Other suitable materials for the sacrificial layers 302 are within the contemplated scope of disclosure. In some embodiments, the dielectric layers 301 may be made of silicon oxide, and the sacrificial layers 302 may be made of silicon nitride. In some embodiments, the dielectric layers 301 and the sacrificial layers 302 may be formed by chemical vapor deposition (CVD), plasma-enhanced chemical vapor deposition (PECVD), physical vapor deposition (PVD), atomic layer deposition (ALD), or other suitable deposition techniques.

Figure 10:
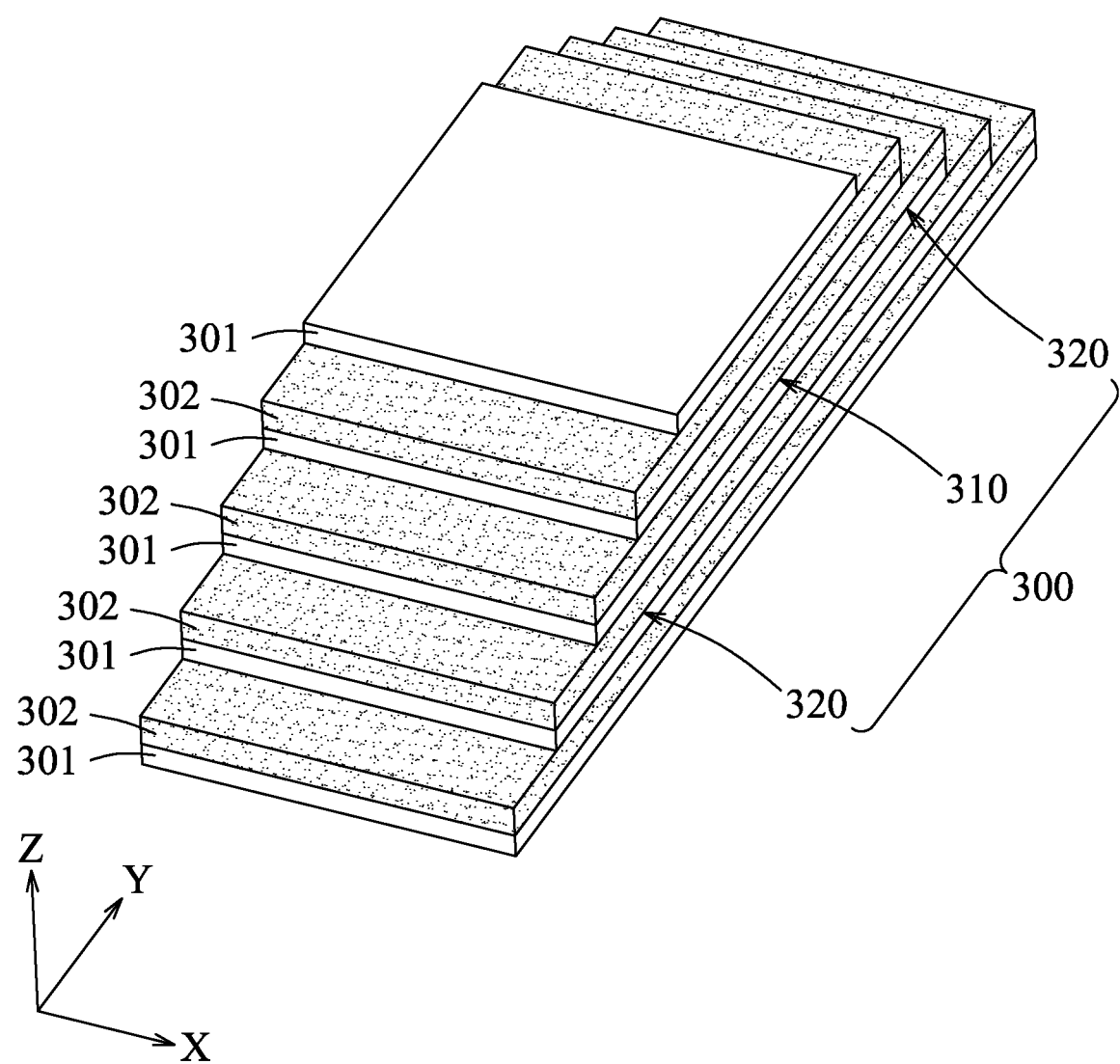

Referring to FIGS. 8 and 10, the method 200 proceeds to step 202, where the stack assembly 300 is patterned such that the patterned stack assembly 300 has a main structure 310 and a staircase structure 320 aside the main structure 310. In some embodiments, in the patterned stack assembly 300, the uppermost one of the dielectric layers 301 may be patterned to have a dimension smaller than those of the sacrificial layers 302 and those of the remaining ones of the dielectric layers 301. The dimension of the uppermost one of the dielectric layers 301 can be used to determine the size of the main structure 310 (i.e., the size of the memory segment 130 of the semiconductor device 100 shown in FIG. 1). Each of the sacrificial layers 302 and the remaining ones of the dielectric layers 301 has a first portion disposed beneath the uppermost one of the dielectric layers 301. The uppermost one of the dielectric layers 301, the first portions of the sacrificial layers 302, and the first portions of the remaining ones of the dielectric layers 301 together constitute the main structure 310 of the patterned stack assembly 300. In some embodiments, each of the sacrificial layers 302 and the remaining ones of the dielectric layers 301 further has a second portion which extends beyond the uppermost one of the dielectric layers 301. In some embodiments, in the patterned stack assembly 300, a distal one of the sacrificial layers 302 has a dimension smaller than that of a proximate one of the sacrificial layers 302 relative to semiconductor substrate 109, and a distal one of the dielectric layers 301 has a dimension smaller than that of a proximate one of the dielectric layers 301 relative to the semiconductor substrate 109. The second portions of the sacrificial layers 302 and the second portions of the remaining ones of the dielectric layers 301 together constitute the staircase structure 320. In some embodiments, the stack assembly 300 may be patterned using a plurality of patterning processes. Each of the patterning processes may include, for example, but not limited to, forming a photoresist and/or a hard mask on the stack assembly 300, performing a lithography process to form a patterned photoresist and/or a patterned hard mask, and performing an etching process to etch the dielectric layer(s) 301 and/or the sacrificial layer(s) 302 through the patterned photoresist and/or the patterned hard mask using, for example, dry etching, wet etching, a combination thereof, or other suitable etching techniques. Because the staircase configuration is formed at this moment, the etching processes for two different dielectric layers (i.e., the dielectric layers 301 and the sacrificial layers 302) are relatively easy compared to the etching processes for multiple-films which include materials other than the dielectric materials, and may result in less defect generation. Furthermore, nonvolatile byproducts which may induce failure of staircase pattern are less likely to be formed during etching of the two different dielectric layers (i.e., the dielectric layers 301 and the sacrificial layers 302). Hence, the staircase structure 320 of the patterned stack assembly 300 has a uniform staircase profile without pattern fail.

Figure 11:
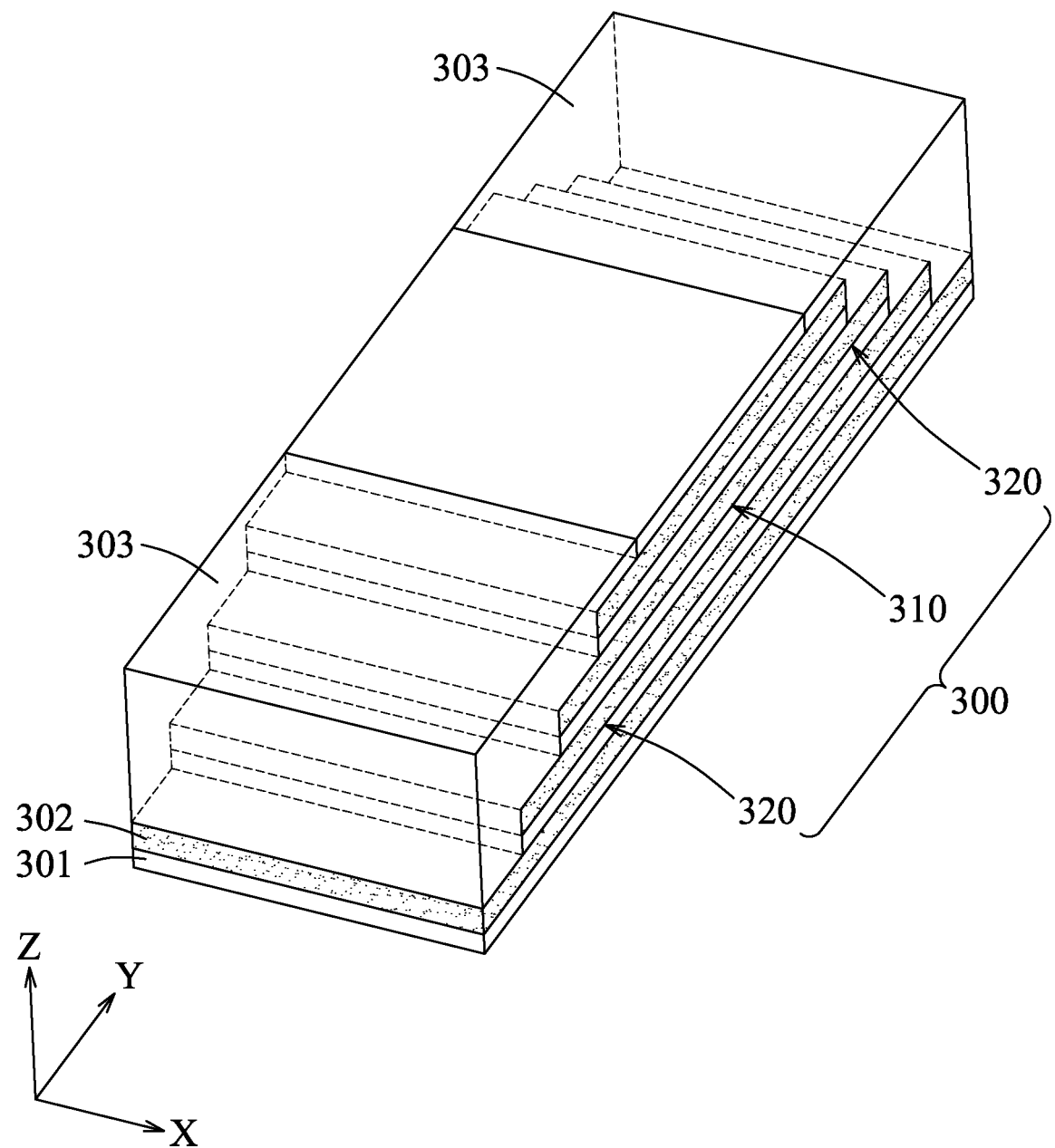

Referring to FIGS. 8 and 11, the method 200 proceeds to step 203, where an IMD layer 303 is formed over the staircase structure 320. In some embodiments, an upper surface of the IMD layer 303 is flush with an upper surface of the main structure 310. In some embodiments, the formation of the IMD layer 303 includes depositing a dielectric material on the patterned stack assembly 300 using CVD, PECVD, PVD, ALD or other suitable deposition techniques, followed by a planarization process, for example, but not limited to, chemical mechanical planarization (CMP), so as to remove an excess of the dielectric material from above the upper surface of the main structure 310. In some embodiments, the dielectric material suitable for forming the IMD layer 303 is similar to the possible materials for the dielectric films 113 described above, and thus details of the possible materials for the IMD layers 303 are omitted for the sake of brevity. In some embodiments, the IMD layer 303 may be made of a dielectric material which is the same as or different from the first dielectric material of the dielectric layers 301. Furthermore, the IMD layer 303 may be made of a dielectric material different from the second dielectric material of the sacrificial layers 302, and thus the second dielectric material of the sacrificial layers 302 can be selectively removed with respect to the IMD layer 303.

Figure 12:
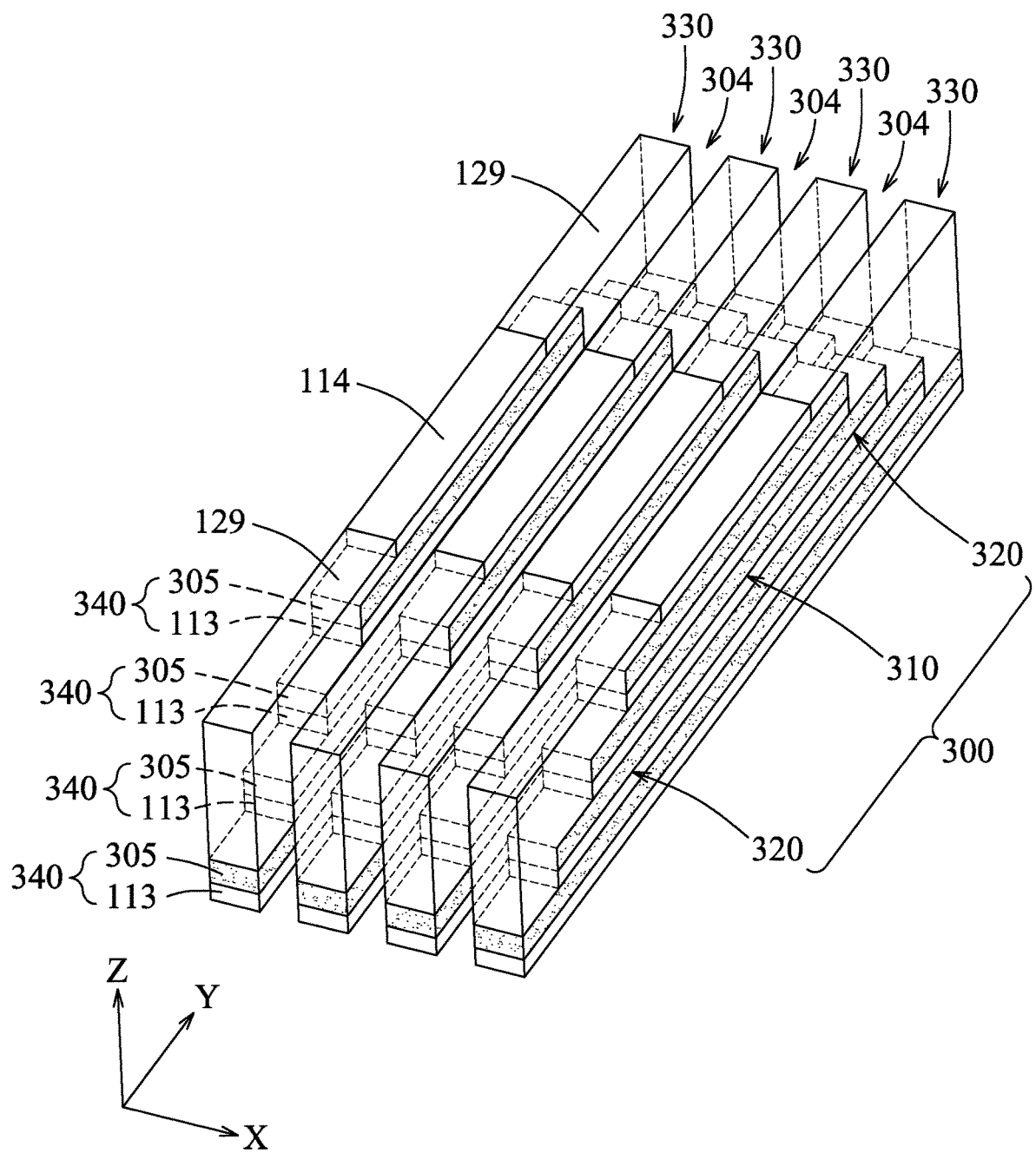

Referring to FIGS. 8 and 12, the method 200 proceeds to step 204, where a plurality of trenches 304 are formed in the patterned stack assembly 300 and the IMD layer 303 so as to form a plurality of preformed stack units 330 spaced apart from each other in the X direction. Each of the preformed stack units 330 includes the above-mentioned IMD part 129 (i.e., a portion of the IMD layer 303 shown in FIG. 11), a portion of the staircase structure 320 and a portion of the main structure 310. In some embodiments, each of the preformed stack units 330 includes the IMD part 129, at least one preformed stack 340 and the upper film 114 (i.e., a portion of the uppermost one of the patterned dielectric layers 301) stacked thereon. The preformed stack 340 includes the dielectric film 113 (i.e., a portion of the patterned dielectric layer 301 shown in FIG. 11) and a sacrificial film 305 (i.e., a portion of the patterned sacrificial layer 302 shown in FIG. 11) which are stacked on each other such that the sacrificial film 305 is disposed between the upper film 114 and the dielectric film 113. In some embodiments, the upper film 114 has a length shorter than that of the at least one preformed stack 340 in the Y direction. In some embodiments, each of the preformed stack units 330 includes the IMD part 129, and a plurality of the preformed stacks 340 which are stacked on each other in the Z direction with the upper film 114 disposed thereon. In each of the preformed stack units 330, the sacrificial films 305 of the preformed stacks 340 are disposed to alternate with the dielectric films 113 of the preformed stacks 340. In some embodiments, a distal one of the preformed stacks 340 has a length in the Y direction shorter than that of a proximate one of the preformed stacks 340 relative to the semiconductor substrate 109. In some embodiments, in each of the preformed stacks 340, the sacrificial film 305 and the dielectric film 113 have the same length in the Y direction. Although the number of the trenches 304 illustrated in FIG. 12 is exemplified as three, the number of the trenches 304 can be varied according to the design for the memory size (or memory density) of the semiconductor device 100. In some embodiments, the trenches 304 may be formed by using a patterning process including a lithography process and an etching process as described in step 202, and thus details of the patterning process are omitted for the sake of brevity. In some embodiments, each of the preformed stack units 330 includes the IMD part 129, a plurality of the dielectric films, and a plurality of sacrificial films 305 disposed to alternate the dielectric films. The uppermost one of the dielectric films disposed over the sacrificial films 305 is the upper film 114, and the remaining ones of the dielectric films are denoted by the numeral 113.

Figure 13:
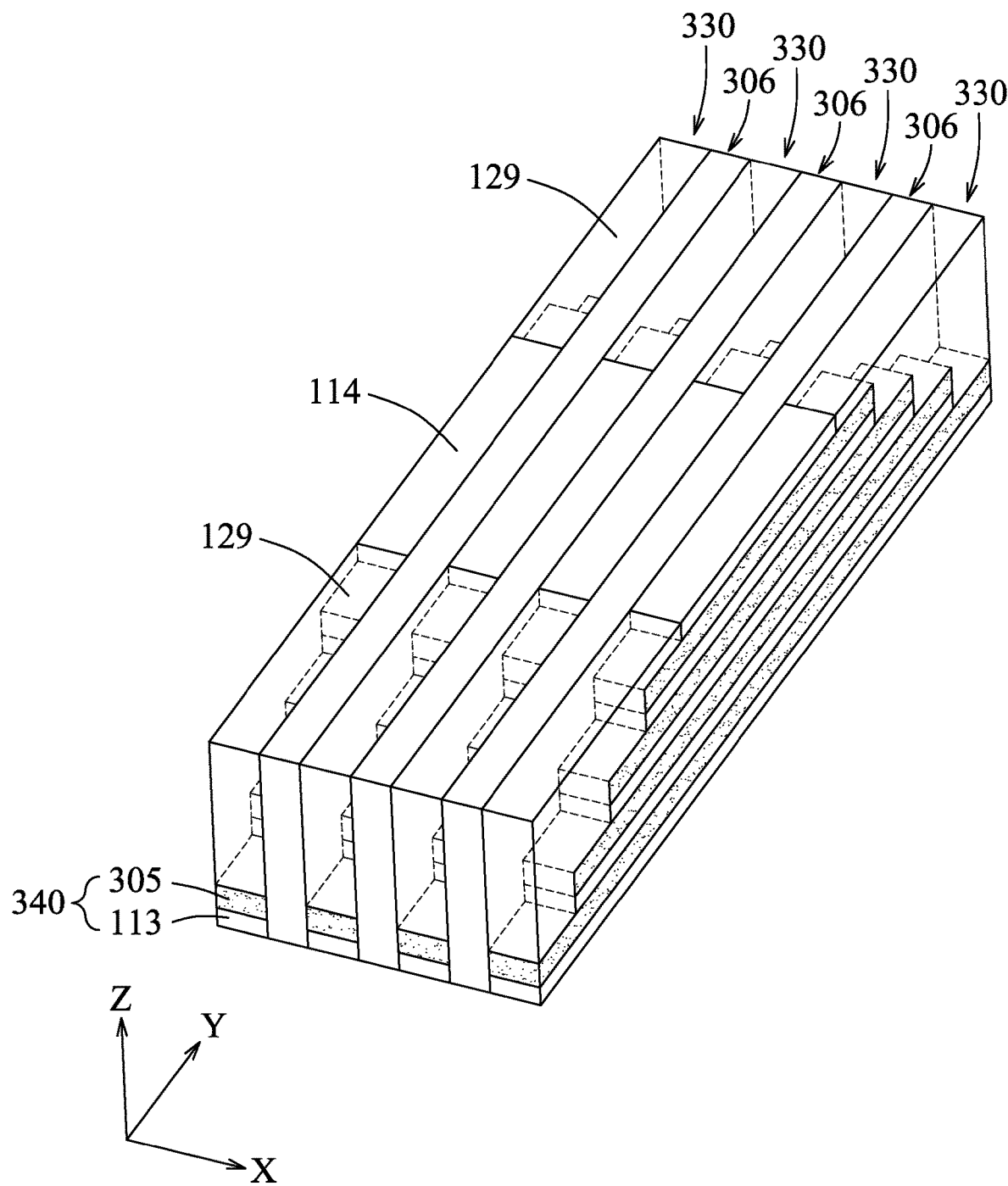
Figure 14:
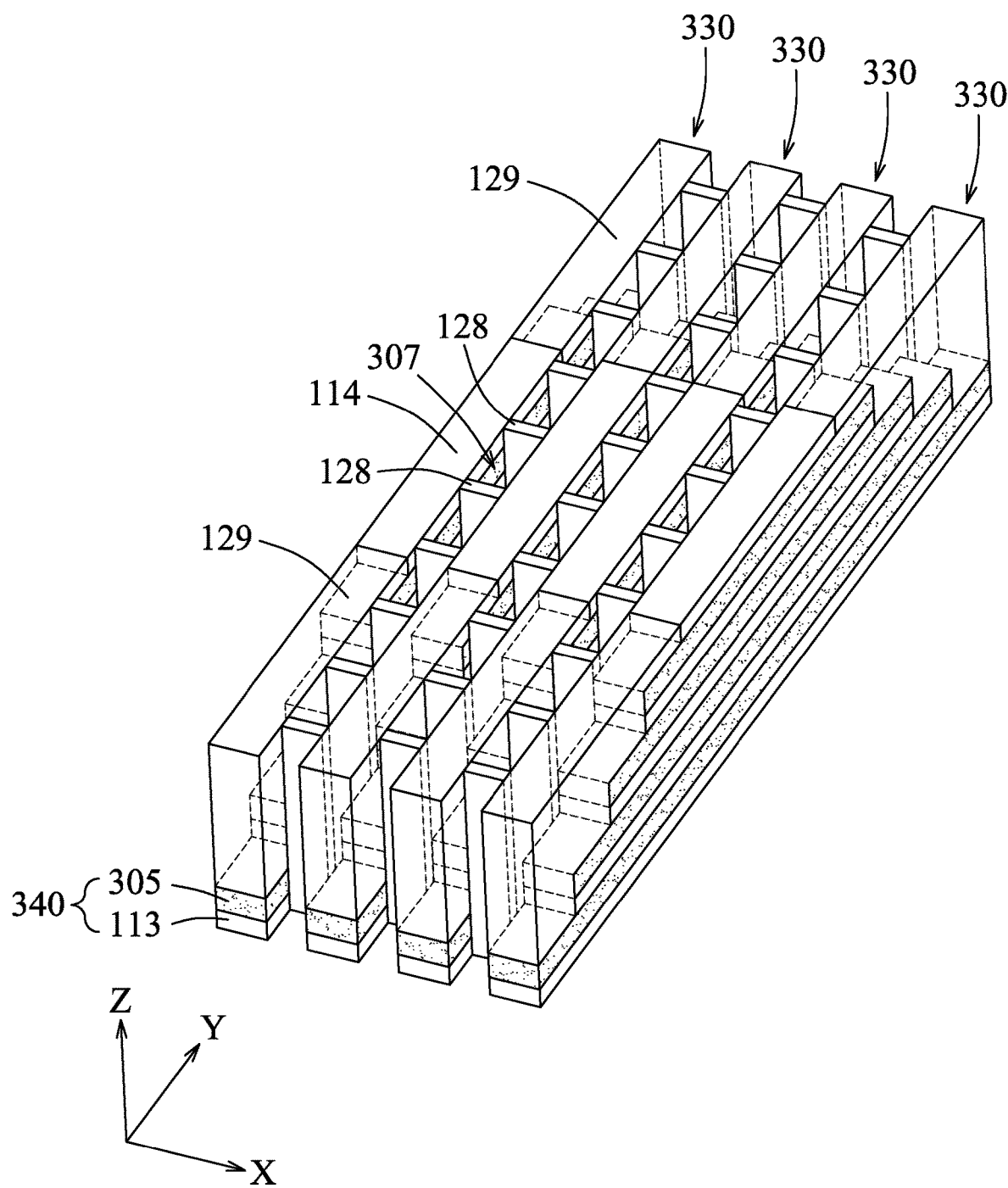

Referring to FIGS. 8, 13 and 14, the method 200 proceeds to step 205, where a plurality of the separators (struts) 128 are formed in each of the trenches 304 (see FIG. 12). In some embodiments, each of the separators 128 is disposed to bridge two adjacent ones of the preformed stack units 330, and two adjacent ones of the separators 128 are spaced apart from each other in the Y direction to form a plurality of openings 307 among the separators 128. In some embodiments, as shown in FIGS. 2 and 14, the separators 128 formed in one of the trenches 304 may be staggered from the separators 128 formed in an adjacent one of the trenches 304, respectively. In some other embodiments, the separators 128 (see FIG. 3) formed in one of the trenches 304 may be in alignment with the separators 128 formed in an adjacent one of the trenches 304, respectively. Although the number of the separators 128 in each of the trenches 304 illustrated in FIG. 14 is exemplified as ten, the number of the separators 128 can be varied according to the design for the memory size (or memory density) of the semiconductor device 100. In some embodiments, the formation of the separators 128 includes the sub-steps of: (i) filling a strut material 306 in the trenches 304 using CVD, PECVD, PVD, ALD or other suitable deposition techniques; (ii) planarizing the strut material 306 using, for example, but not limited to, CMP, to remove an excess of the strut material 306 so that the upper film 114 is exposed to permit an upper surface of the planarized strut material 306 to be flush with the upper surface of the preformed stack units 330; and (iii) patterning the planarized strut material 306 so as to form a plurality of the separators 128 using a patterning process. The patterning process may include a lithography process and an etching process as described in step 202, and thus details thereof are omitted for the sake of brevity. In some embodiments, the strut material 306 used for forming the separators 128 are as described above, and thus details of the possible material for the strut material 306 are omitted for the sake of brevity. In some embodiments, the strut material 306 may be the same as or different from the first dielectric material of the dielectric layers 301. Furthermore, the strut material 306 may be different from the second dielectric material of the sacrificial layers 302, and thus the second dielectric material of the sacrificial layers 302 can be selectively removed with respect to the separators 128.

Figure 15:
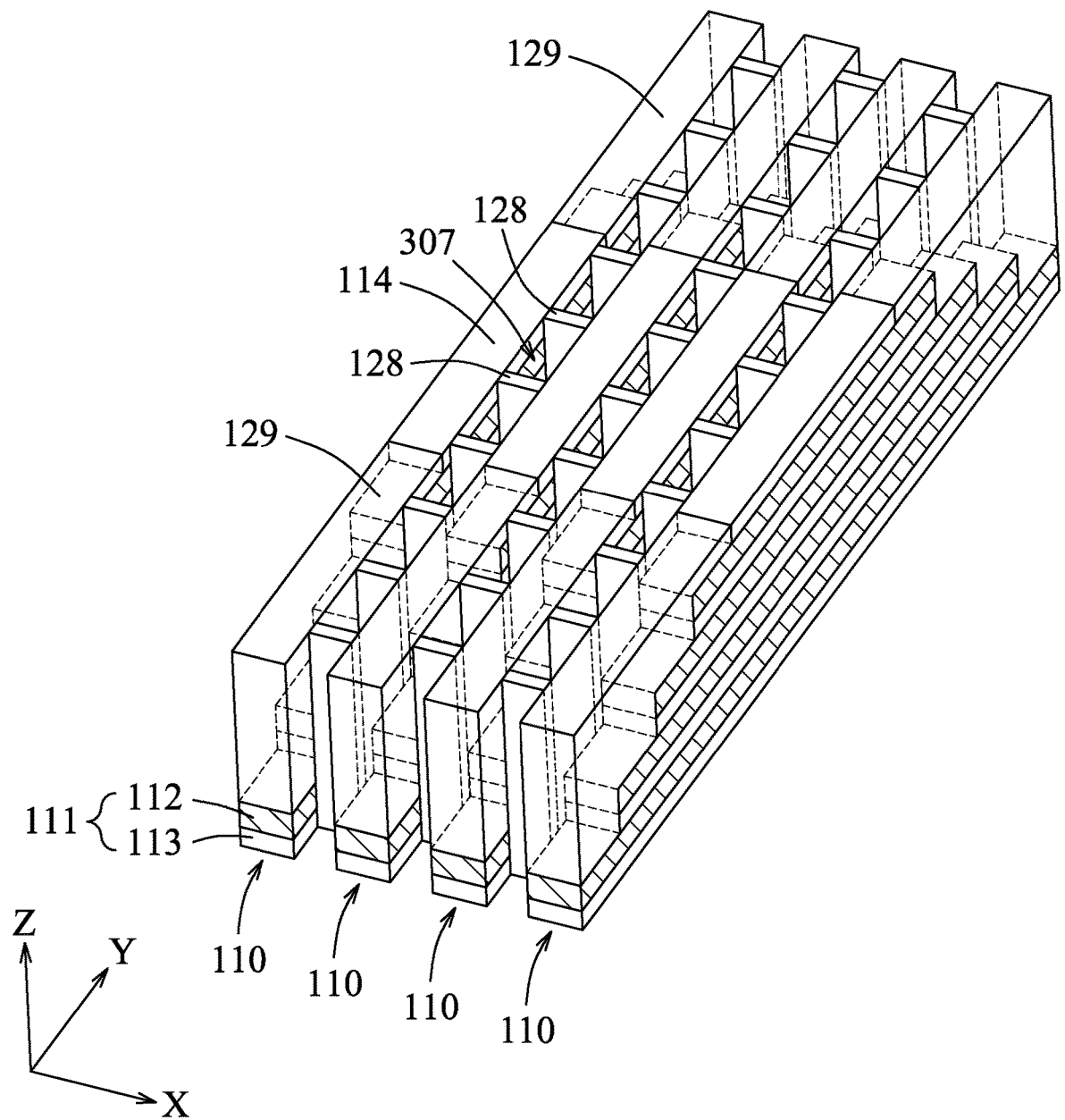

Referring to FIGS. 8 and 15, the method 200 proceeds to step 206, where the sacrificial films 305 of each of the preformed stack units 330 shown in FIG. 14 are respectively replaced with the conductive films 112 through the openings 307, such that the stack units 110, each of which includes the conductive films 112 and the dielectric films 113, as described above, are formed. In some embodiments, step 206 may include sub-steps (i) to (iii). In sub-step (i), the sacrificial films 305 are removed to form a plurality of recesses (not shown), each of which is located between two adjacent ones of the dielectric films 113 in the Z direction, using an isotropic etching process, such as wet etching, or other suitable etching techniques. An etchant in the isotropic etching process can selectively remove the sacrificial films 305 without removing the separators 128, the dielectric films 113, and the patterned IMD layer 303 (i.e., the IMD part 129). In the case that the dielectric films 112 are made of silicon oxide, and the sacrificial films 305 are made of silicon nitride, the etchant may include phosphoric acid, which selectively etches silicon nitride rather than silicon oxide and other materials known in the art of semiconductor fabrication. Therefore, the separators 128 are able to provide structural support for the IMD part 129 and the dielectric films 113 when the recesses are formed. In sub-step (ii), a first conductive material (not shown) is filled in the recesses using CVD, PVD, PECVD, ALD, or other suitable deposition techniques. In some embodiments, the first conductive material may also be conformally deposited on the separators 128, the IMD part 129, the dielectric films 113, and the upper film 114 through the openings 307 when a conformal deposition technique, such as ALD, is used. In sub-step (iii), an excess of the first conductive material is removed through the openings 307 to leave the above-mentioned conductive films 112 in the recesses. Sub-step (iii) may be performed using isotropic wet etching, anisotropic dry etching, or a combination thereof. Each of the conductive films 112 has a side surface flush with side surfaces of the dielectric films 113. Because the conductive films 112, which serves as word lines, are formed by an etching back process, as described in sub-step (iii), defects, such as word line open (i.e., metal loss between two adjacent upper and lower ones of the dielectric films 113), can be effectively reduced.

Figure 16:
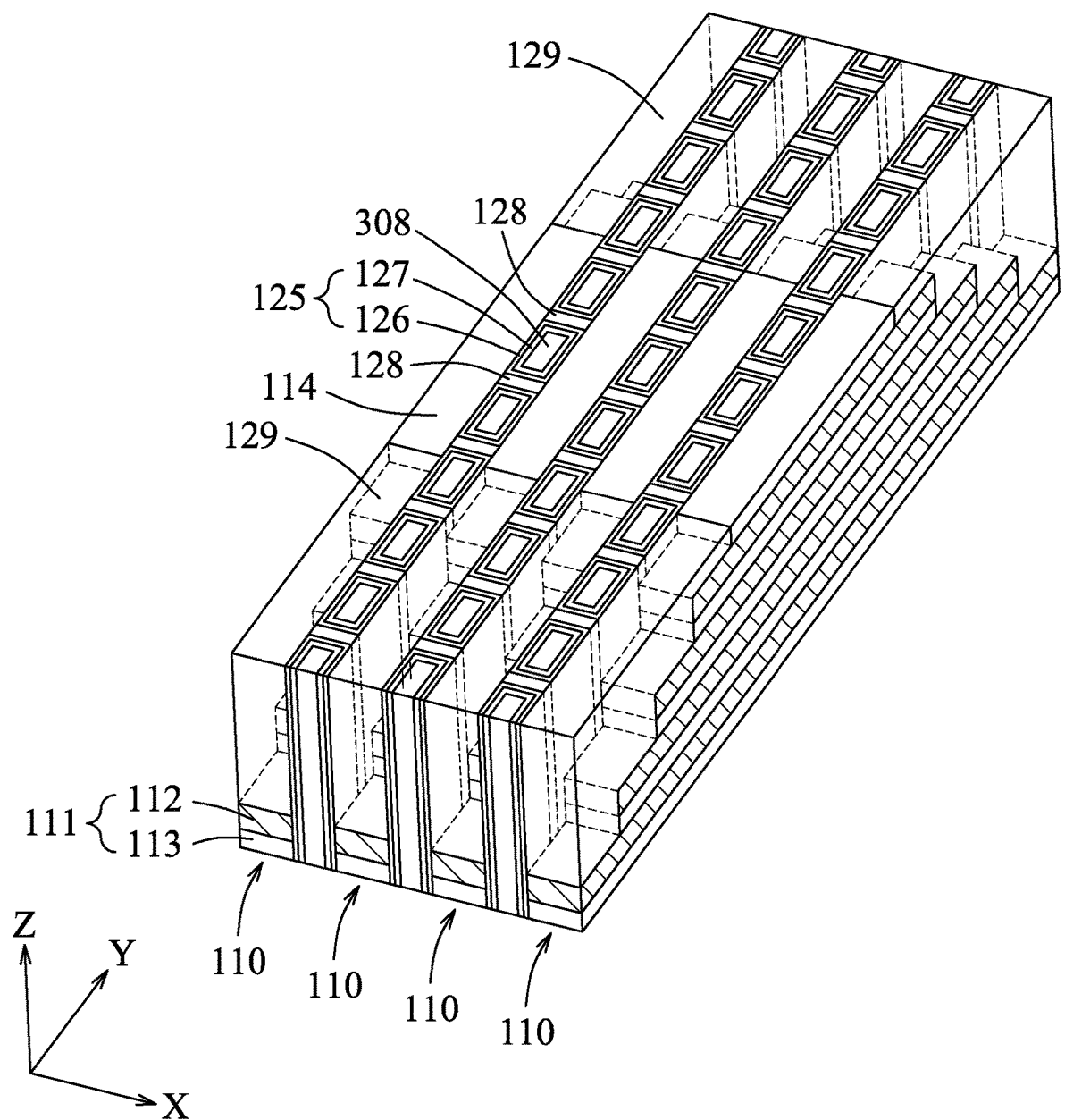
Figure 17:
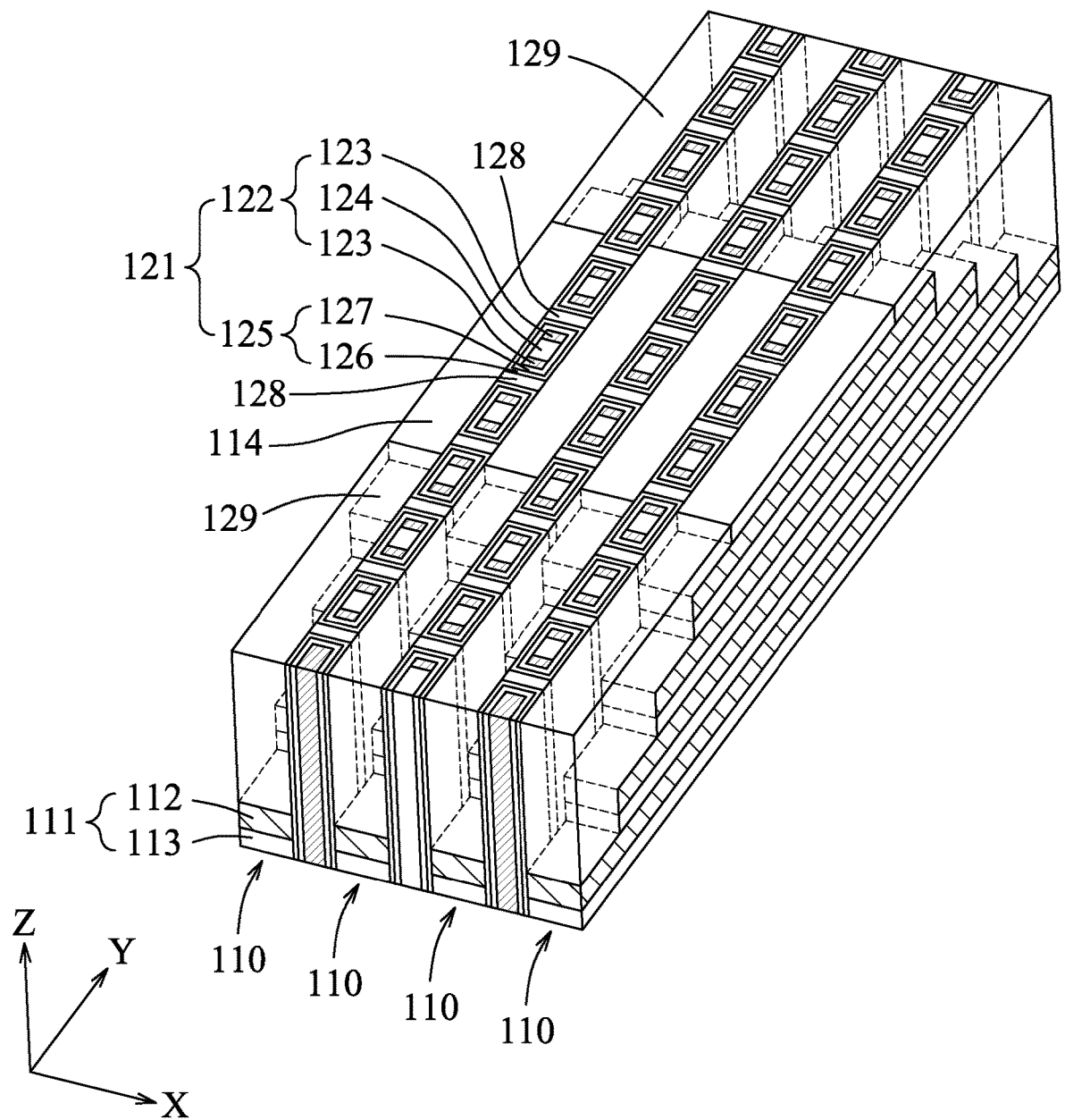

Referring to FIGS. 8, 16 and 17, the method 200 proceeds to step 207, where a plurality of the repeating units 121 are formed in the openings 307 (see FIG. 15), respectively. In some embodiments, the formation of each of the repeating units 121 may include (i) sequentially forming the memory film 126 and the channel film 127 in a corresponding one of the openings 307 such that the channel film 127 is separated from the conductive films 112 of two adjacent ones of the stack units 110 through the memory film 126, (ii) filling an isolation part 308 in the corresponding opening 307 such that the isolation part 308 is surrounded by the channel film 127, (iii) patterning the isolation part 308 to form two holes (not shown) which are separated from each other in the Y direction, and (iv) filling a second conductive material in the two holes so as to permit the two conductive pillars 123 to be respectively formed in the two holes and so as to permit a remaining portion of the isolation part 308 to serve as the above-mentioned isolation region 124. In addition, the conductive pillars 123 are surrounded by the channel film 127 and are separated from each other through the isolation region 124. In some embodiments, the memory film 126, the channel film 127 as described above may be independently formed using CVD, PECVD, PVD, ALD, or other suitable deposition techniques. In some embodiments, before filling the isolation part 308, bottom portions of the channel film 127 and the memory film 126 in the corresponding opening 307 may be removed using a patterning process. The patterning process may include a lithography process and an etching process as described in step 202, and thus details thereof are omitted for the sake of brevity. In some embodiments, the isolation part 308 may be made of a dielectric material similar to the materials for the isolation region 124, and thus details of the possible materials for the isolation part 308 are omitted for the sake of brevity. In some embodiments, the isolation part 308 may be filled using CVD, PECVD, PVD, ALD, or other suitable deposition techniques, followed by a planarization process, for example, but not limited to, CMP, to remove an excess of the isolation part 308 so that the upper film 114 is exposed. In some embodiments, since the patterning of the isolation part 308 may be similar to the patterning process as described in step 202, details thereof are omitted for the sake of brevity. In some embodiments, the second conductive material of the conductive pillars 123 may be similar to the first conductive material of the conductive films 112, and thus details of the second conductive material are omitted for the sake of brevity. In some embodiments, the conductive pillars 123 may be formed using CVD, PECVD, PVD, ALD, or other suitable deposition techniques, followed by a planarization process, for example, but not limited to, CMP, to remove an excess of the second conductive material so that the upper film 114 is exposed.

Figure 18:
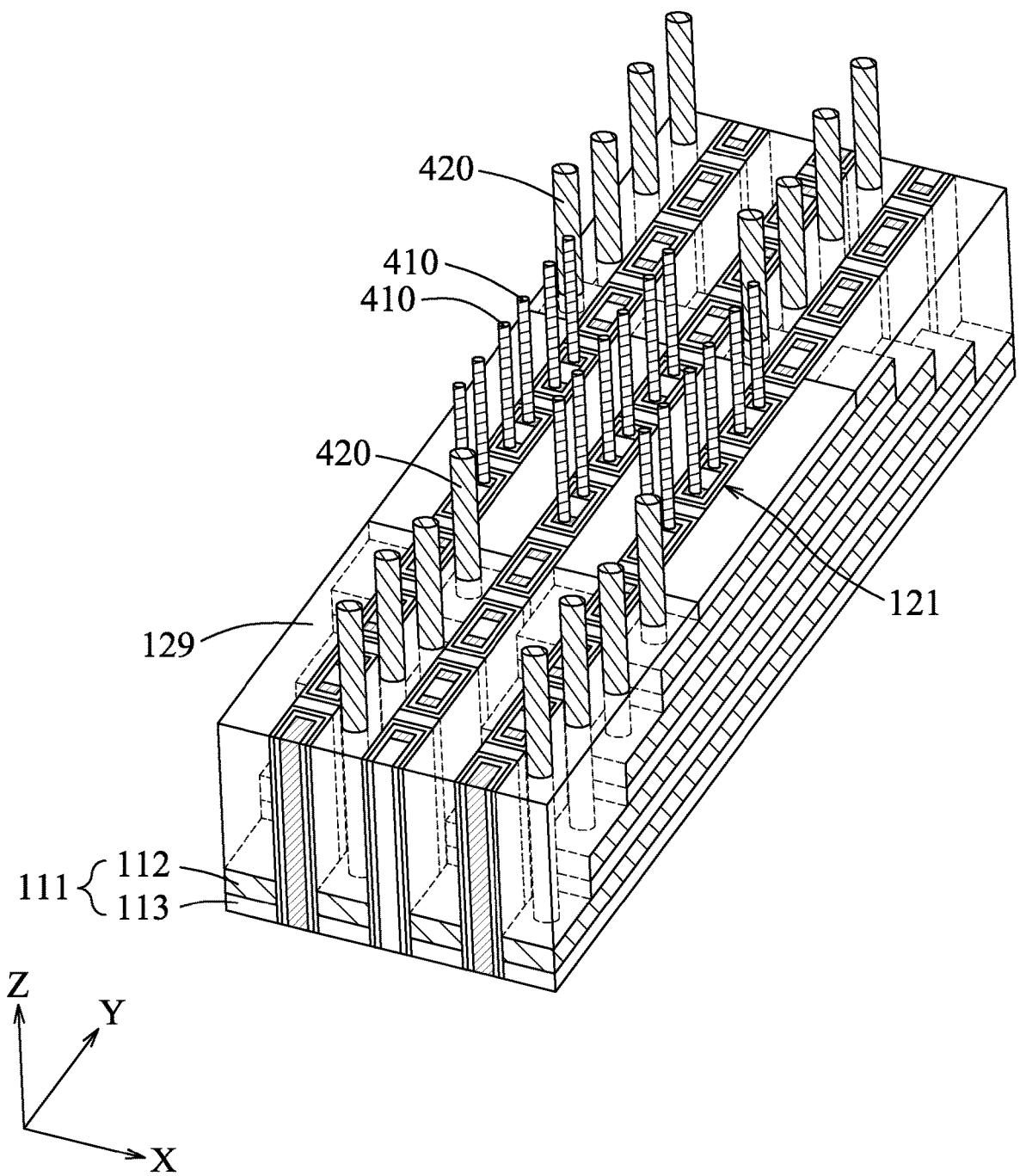

Referring to FIGS. 8 and 18, the method 200 proceeds to step 208, where a pair of first conductive contacts 410 are formed to be electrically connected to the conductive pillars 123 (i.e., source and bit lines) in each of the repeating units 121, respectively, and a plurality of second conductive contacts 420 are formed to extend through the IMD parts 129 so as to be electrically connected to the conductive films 112 (i.e., word lines), respectively. In some embodiments, the first conductive contacts 410 are used to connect a source and bit line decoder, respectively, and the second conductive contacts 420 are used to connect word line decoders for controlling the memory cells.

In some embodiments, some steps in the method 200 may be modified, replaced, or eliminated without departure from the spirit and scope of the present disclosure. In some alternative embodiments, other suitable methods may also be applied for forming the semiconductor device 100.

Figure 19:
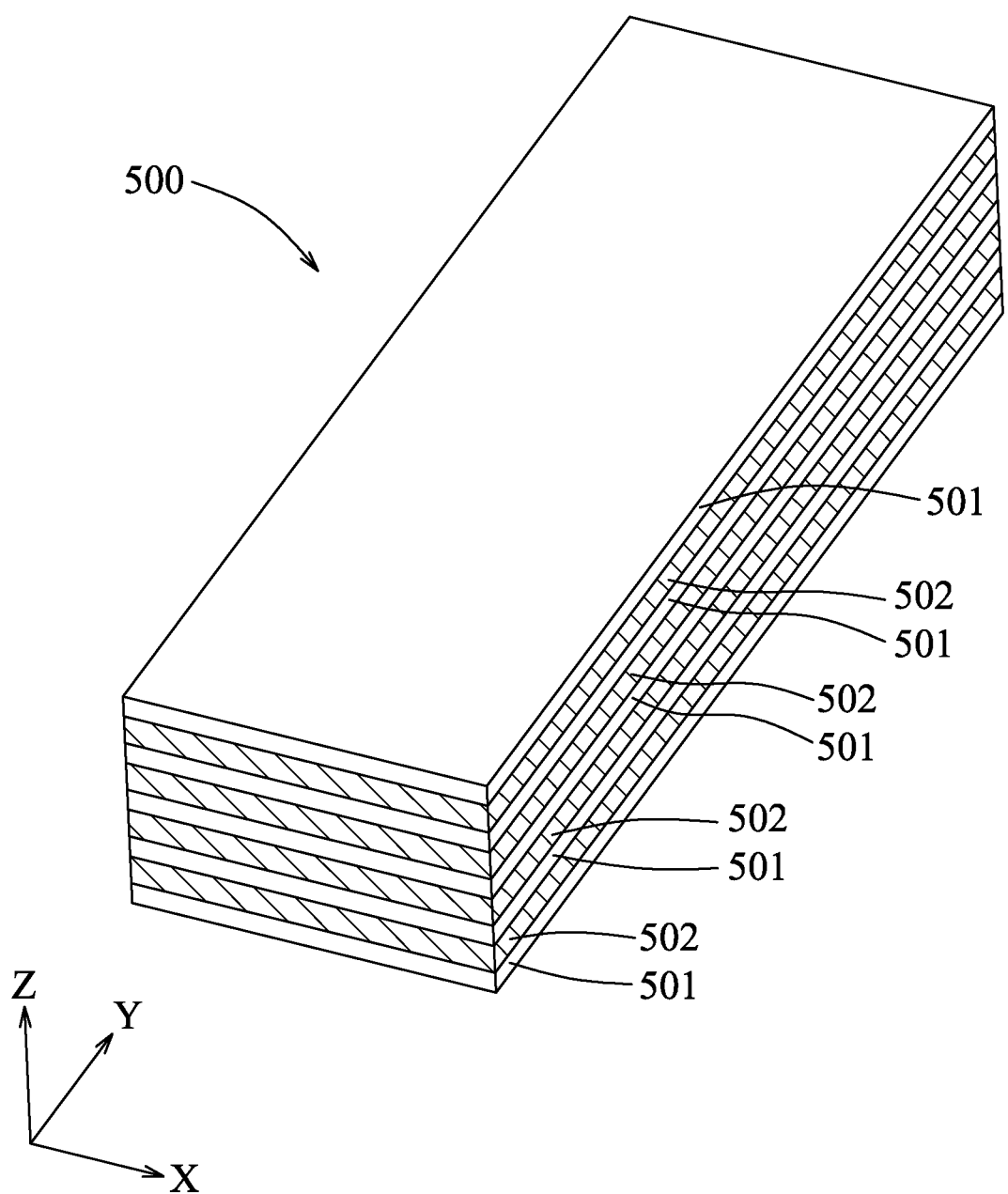
FIGS. 19 to 24 are schematic views illustrating intermediate stages of a method in which a staircase-last process is used accordance with some embodiments.
Figure 20:
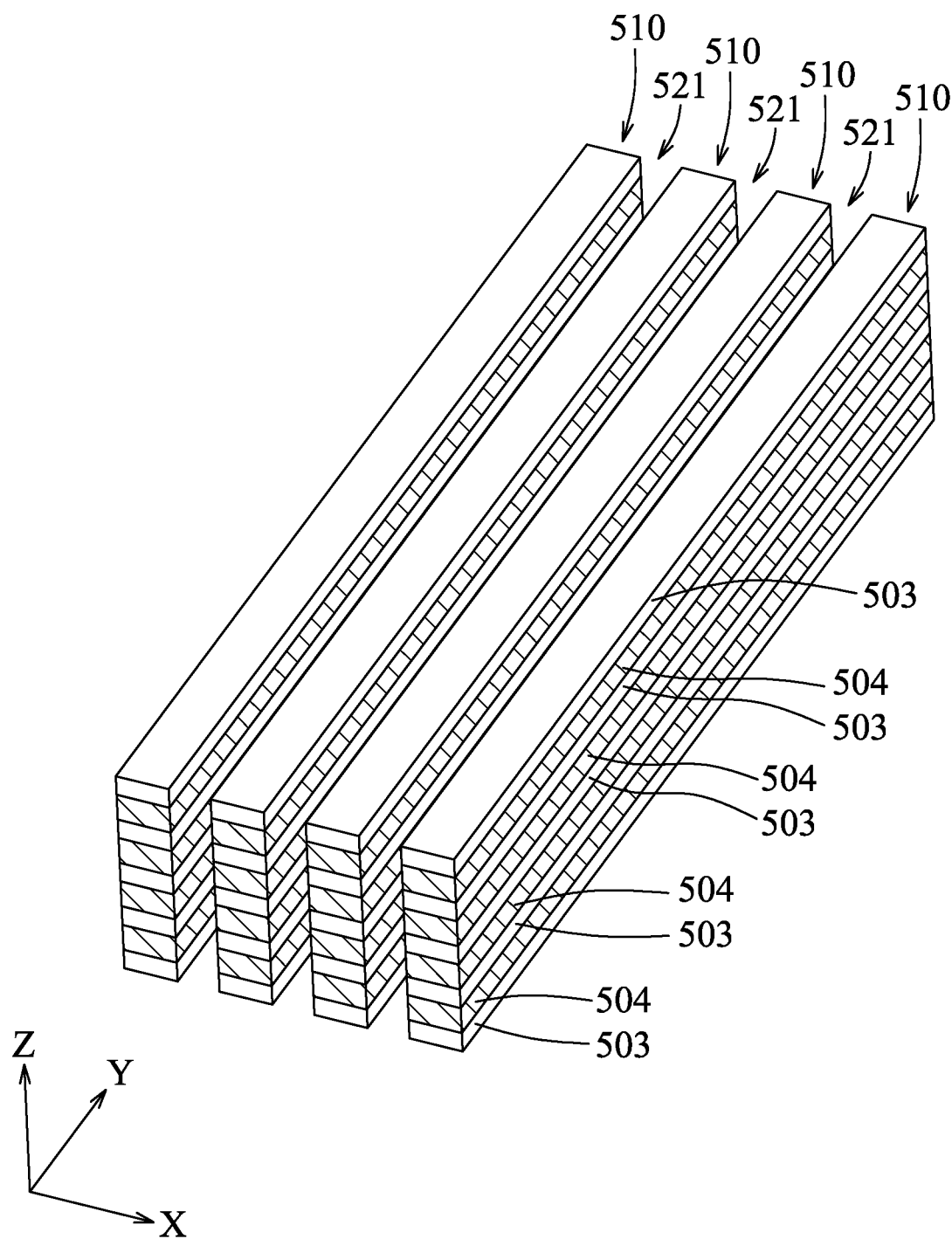
Figure 21:
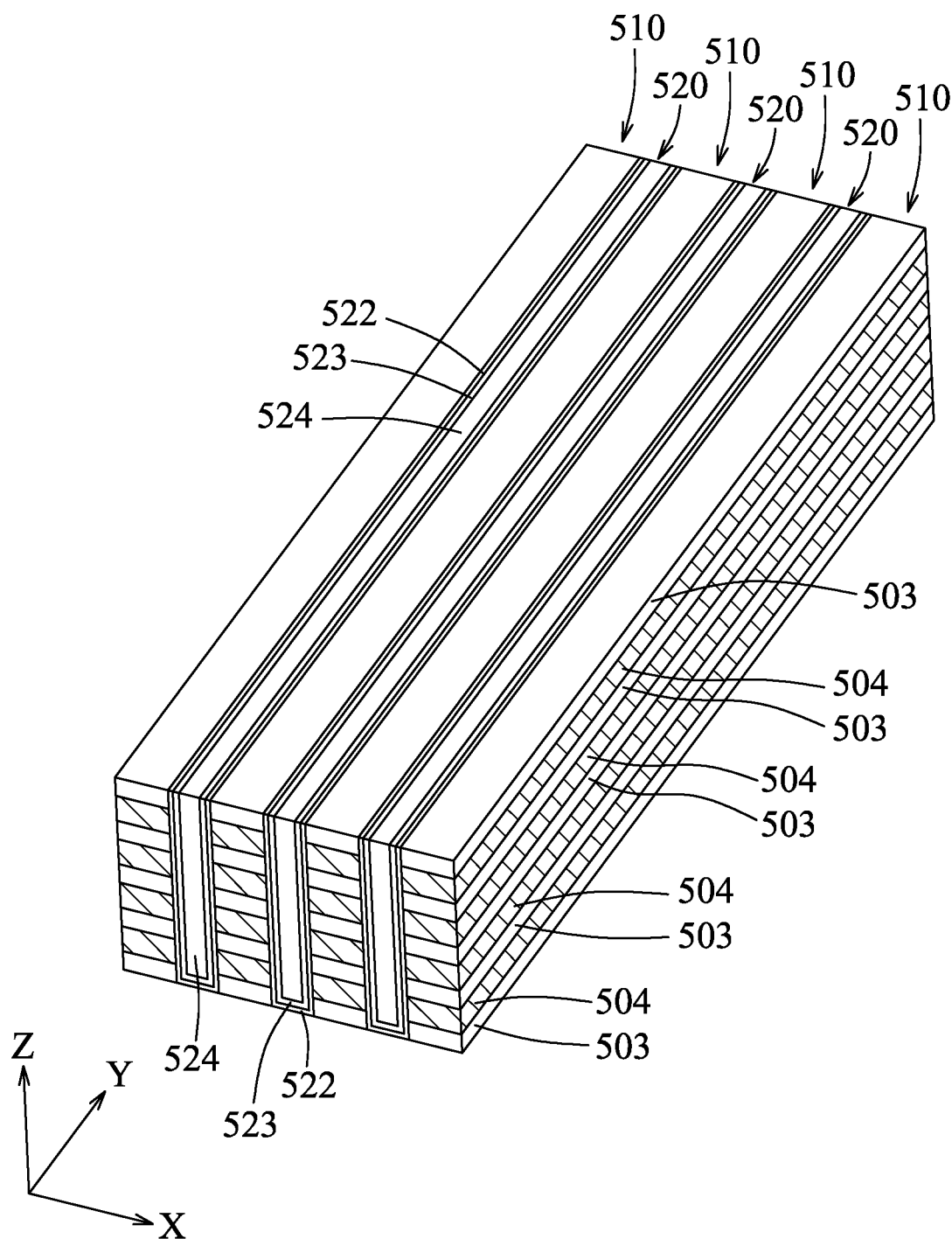
Figure 22:
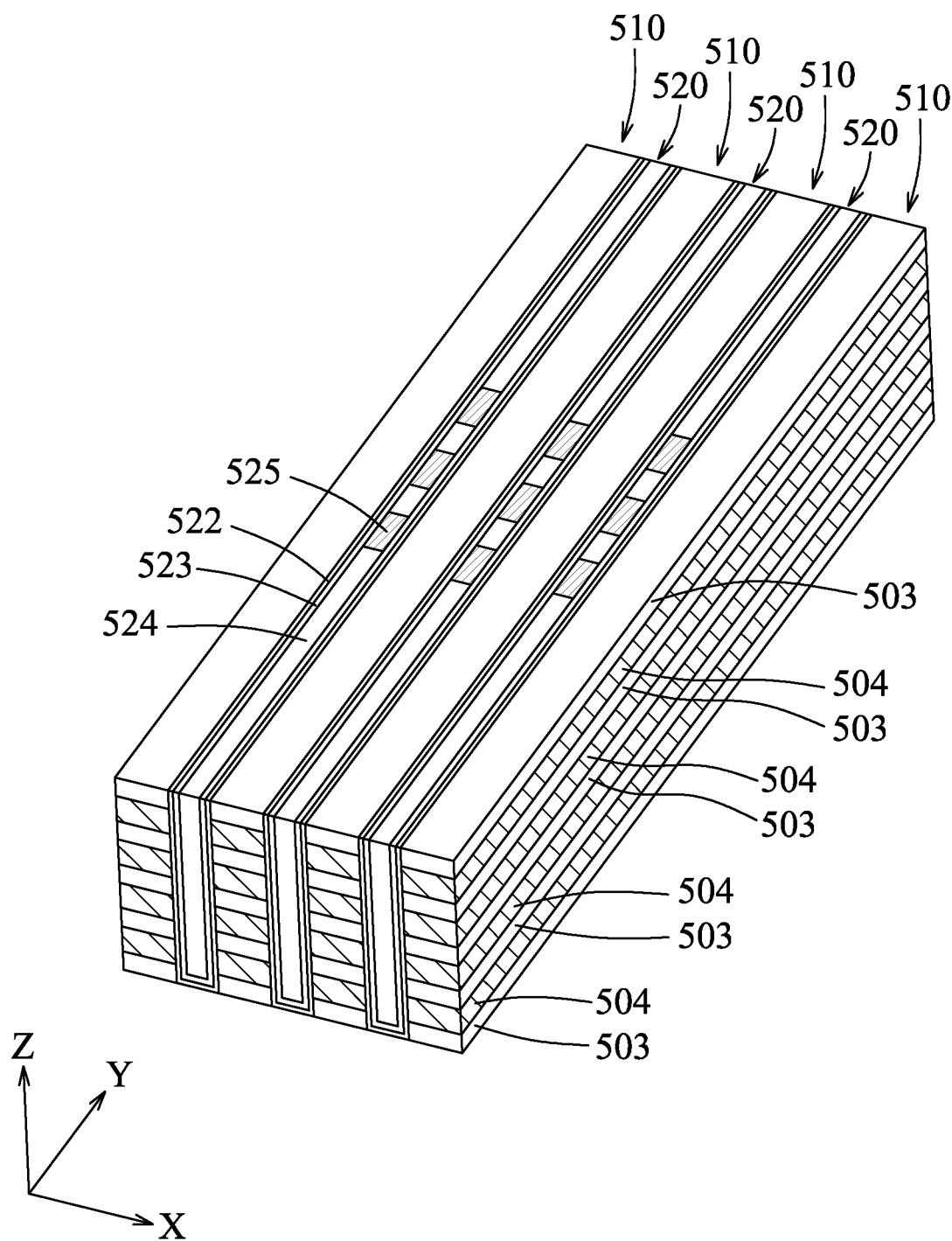
Figure 23:
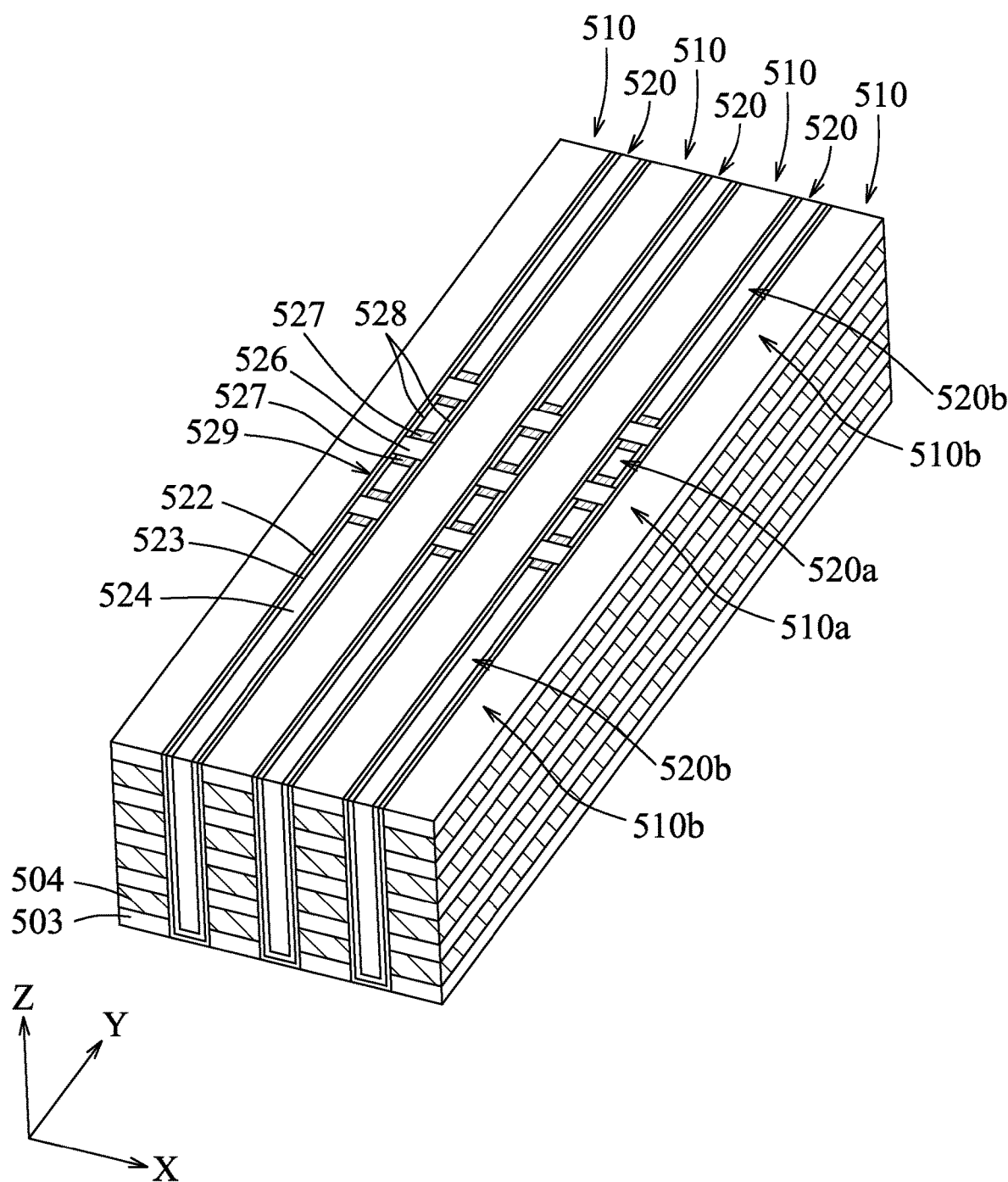
Figure 24:
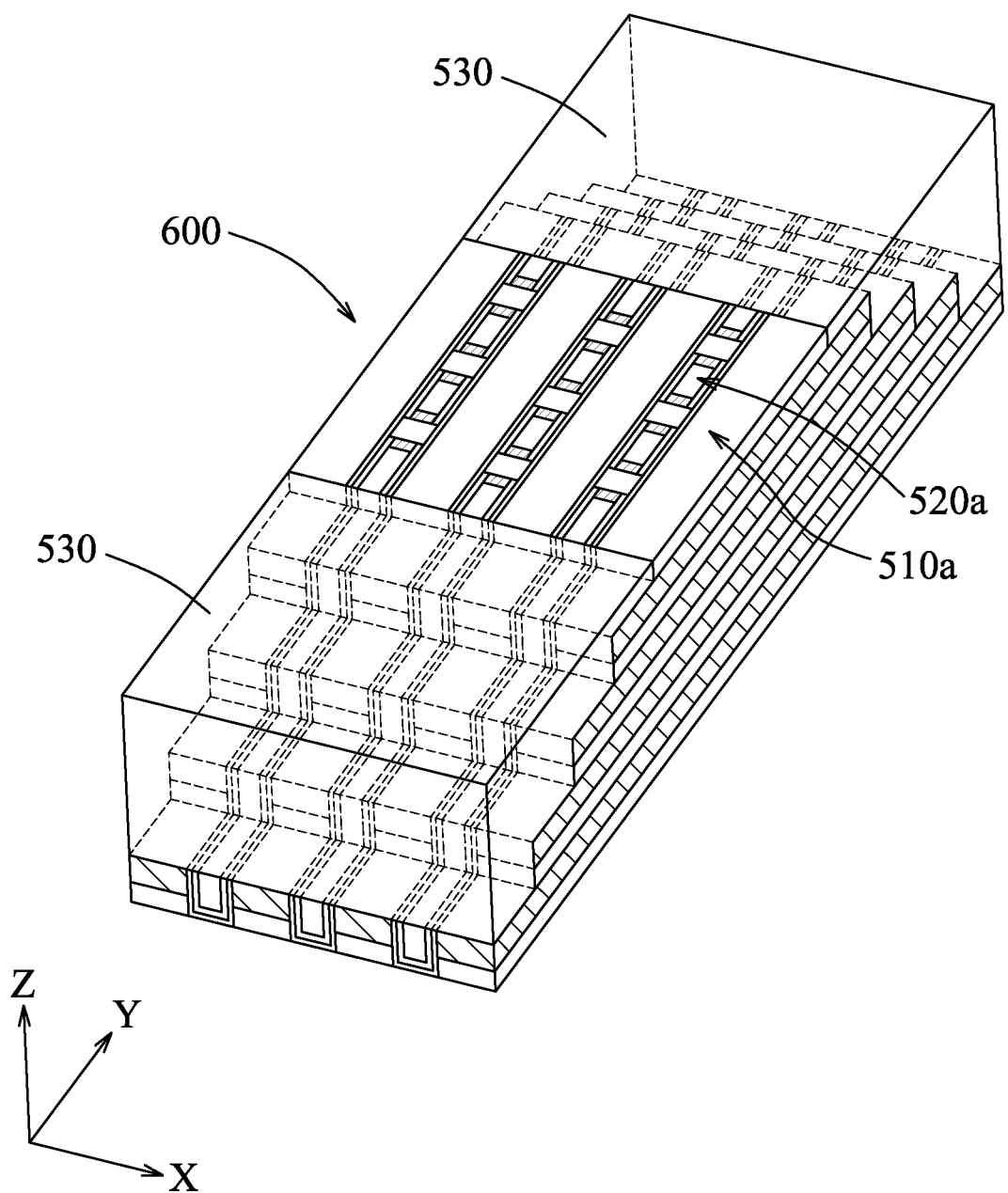

In some alternative embodiments, a semiconductor device 600 (shown in FIG. 24) may be made using another method which is similar to the method 200 except that the staircase configuration is formed after forming the repeating units (i.e., the staircase-last process). The method may include steps (a) to (h). FIGS. 19 to 24 illustrate schematic views of the intermediate stages of the method in accordance with some embodiments. In step (a), as shown in FIG. 19, an OMO (oxide-metal-oxide) stack assembly 500 is formed over a semiconductor substrate (similar to the semiconductor substrate 109 shown in FIG. 1). The OMO stack assembly 500 includes a plurality of dielectric layers 501 and a plurality of conductive layers 502 disposed to alternate with the dielectric layers 501, and an uppermost layer of the OMO stack assembly 500 is a dielectric layer. In step (b), as shown in FIG. 20, a plurality of trenches 521 are formed to separate the OMO stack assembly 500 into a plurality of stack units 510 each including a plurality of dielectric films 503 and a plurality of conductive films 504. The conductive films 504 may serve as word lines. In step (c), as shown in FIG. 21, a memory material, a channel material, and an isolation material are sequentially deposited over the stack units 510 to fill the trenches 521 (see FIG. 20), and then excess materials over the stack units 510 are removed using a planarization step, such as, but not limited to, CMP, so as to form a plurality of features 520 which are disposed to alternate with the stack units 510. Each of the features 520 includes a memory layer 522, a channel layer 523, and an isolation part 524. In step (d), as shown in FIG. 22, a plurality of through holes (not shown) are formed in the isolation part 524 of each of the features 520, and then, a conductive material is formed over the stack units 510 and the features 520 to fill the through holes, followed by removal of an excess of conductive material to form conductive portions 525 in the through holes. In step (e), as shown in FIG. 23, a plurality of separators 526 are formed respectively in the conductive portions 525 such that each of the conductive portions 525 shown in FIG. 22 is separated into two conductive pillars 527, and such that the channel layer 523 is separated into a plurality of channel portions 528. After step (e), each of the features 520 can be divided into a main segment 520a and a lateral segment 520b. The main segment 520a has a plurality of repeating units 529 which alternate with the separators 526. Each of the stack units 510 also includes a main segment 510a and a lateral segment 510b. Each of the conductive pillars 527 in each of the features 520 may serve as a corresponding one of source lines and bit lines. In step (f), as shown in FIG. 24, the lateral segments 510b, 520b of the features 520 and the stack units 510 (see FIG. 23) are patterned to form a staircase structure, and an IMD layer 530 is formed on the staircase structure such that an upper surface of the IMD layer 530 is flush with those of the main segments 510a, 520a of the features 520 and the stack units 510. The materials for the dielectric layers 501 (dielectric films 503), the conductive layers 502 (conductive films 504), the memory layer 522, the channel layer 523, the isolation part 524, the separator 526, and the conductive pillars 527 are similar to those described in the method 200, and thus details thereof are omitted for the sake of brevity.

In this disclosure, a method utilizing a staircase-first process, and a word line replacement process are involved for forming the semiconductor device. To form the staircase configuration using the staircase-first process, an etching process is applied for etching two different dielectric materials (i.e., the dielectric layers and the sacrificial layers), and is relatively easy to control (i.e., the defects may be eliminated and/or reduced). Therefore, the semiconductor device may have more uniform staircase profile. In addition, struts are used to stabilize the patterned dielectric films during the word line replacement process, and can also serve as separators (i.e., cell isolations for the repeating units). Furthermore, the processes involved in the method utilizing the staircase-first process can be fully compatible with those for manufacturing normal semiconductor devices. Therefore, the method of the disclosure is useful for manufacturing a semiconductor device, especially a 3D memory device, in an effective manner.

In accordance with some embodiments of the present disclosure, a semiconductor device includes a semiconductor substrate, a first stack unit disposed over the semiconductor substrate, a second stack unit disposed over the semiconductor substrate and spaced apart from the first stack unit, and a first feature disposed between the first and second stack units. The first stack unit includes at least one first stack that includes a first conductive film and a first dielectric film which are stacked on each other. The second stack unit includes at least one second stack that includes a second conductive film and a second dielectric film which are stacked on each other. The first feature includes a plurality of first repeating units and a plurality of first separators which are disposed to alternate with the first repeating units. Each of the first repeating units includes a first inner portion and a first outer portion surrounding the first inner portion so as to separate the first inner portion from the first and second stack units and two adjacent ones of the first separators. The first inner portion includes a pair of first conductive pillars which are separated from each other. The first outer portion includes a first memory film and a first channel film which is disposed between the first memory film and the first inner portion.

In accordance with some embodiments of the present disclosure, the semiconductor device includes a plurality of thin film transistors. Each of the first and second conductive films serves as a word line, and the first conductive pillars serve as a bit line and a source line, respectively. The word line has a plurality of word line portions, each of which serves as a gate electrode of a corresponding one of the thin film transistors. The source line has a plurality of source line portions, each of which serves as a first source/drain electrode of a corresponding one of the thin film transistors. The bit line has a plurality of bit line portions, each of which serves as a second source/drain electrode of a corresponding one of the thin film transistors.

In accordance with some embodiments of the present disclosure, the first inner portion further includes a first isolation region disposed to separate the first conductive pillars.

In accordance with some embodiments of the present disclosure, the first stack unit further includes a first upper film, and the second stack unit further includes a second upper film. The first upper film is made of a dielectric material, and is disposed on the at least one first stack, such that the first conductive film is disposed between the first upper film and the first dielectric film. The second stack unit is made of a dielectric material, and is disposed on the at least one second stack, such that the second conductive film is disposed between the second upper film and the second dielectric film. Furthermore, the first upper film has a length shorter than that of the at least one first stack, and the second upper film has a length shorter than that of the at least one second stack.

In accordance with some embodiments of the present disclosure, the first stack unit includes a plurality of the first stacks, and the second stack unit includes a plurality of the second stacks. A distal one of the first stacks has a length shorter than that of a proximate one of the first stacks relative to the semiconductor substrate. The first conductive films of the first stacks are disposed to alternate with the first dielectric films of the first stacks. A distal one of the second stacks has a length shorter than that of a proximate one of the second stacks relative to the semiconductor substrate. The second conductive films of the second stacks are disposed to alternate with the second dielectric films of the second stacks. Furthermore, the first conductive pillars of each of the first repeating units extend in a direction transverse to that of the first conductive films of the first stacks and the second conductive films of the second stacks.

In accordance with some embodiments of the present disclosure, in each of the first stacks, the first conductive film and the first dielectric film have the same length. In each of the second stacks, the second conductive film and the second dielectric film have the same length.

In accordance with some embodiments of the present disclosure, the semiconductor device further includes a third stack unit and a second feature. The third stack unit is disposed over the semiconductor substrate and spaced apart from the second stack unit, such that the second stack unit is disposed between the first stack unit and the third stack unit. The second feature is disposed between the second stack unit and the third stack unit. The third stack unit includes at least one third stack that includes a third conductive film and a third dielectric film which are stacked on each other. The second feature includes a plurality of second repeating units and a plurality of second separators disposed to alternate with the second repeating units. Each of the second repeating units includes a second inner portion and a second outer portion that is disposed to separate the second inner portion from the second and third stack units and two adjacent ones of the second separators. The second inner portion includes a pair of second conductive pillars which are separated from each other, and the second outer portion includes a second memory film and a second channel film which is disposed between the second memory film and the second inner portion.

In accordance with some embodiments of the present disclosure, the first conductive pillars of the first repeating units are staggered from the second conductive pillars of the second repeating units, respectively.

In accordance with some embodiments of the present disclosure, the first conductive pillars of the first repeating units are in alignment with the second conductive pillars of the second repeating units, respectively.

In accordance with some embodiments of the present disclosure, a method for manufacturing a semiconductor device includes: forming two preformed stack units over a semiconductor substrate, the preformed stack units being spaced apart from each other by a trench, each of the preformed stack units including at least one preformed stack and an upper film which is stacked on the at least one preformed stack, and which is made of a dielectric material, the preformed stack including a dielectric film and a sacrificial film which are stacked on each other such that the sacrificial film is disposed between the upper film and the dielectric film; forming a plurality of separators in the trench, each of the separators bridging the preformed stack units, two adjacent ones of the separators being spaced apart from each other so as to form a plurality of openings among the separators; replacing the sacrificial film of each of the preformed stack units with a conductive film through the openings; and forming a plurality of repeating units in the openings, respectively.

In accordance with some embodiments of the present disclosure, each of the repeating units is formed by forming a memory film and a channel film in a corresponding one of the openings such that the channel film is separated from the conductive films through the memory film, and forming two conductive pillars in the corresponding opening such that the conductive pillars are surrounded by the channel film and separated from each other by an isolation region.

In accordance with some embodiments of the present disclosure, the conductive pillars are formed by filling an isolation in the corresponding opening such that the isolation is surrounded by the channel film, patterning the isolation to form two holes which are separated from each other, and filling a conductive material in the two holes so as to permit the conductive pillars to be respectively formed in the two holes and so as to permit a remaining region of the isolation to serve as the isolation region.

In accordance with some embodiments of the present disclosure, each of the preformed stack units includes a plurality of the preformed stacks. A distal one of the preformed stacks has a length shorter than that of a proximate one of the preformed stacks relative to the semiconductor substrate. The sacrificial films of the preformed stacks are disposed to alternate with the dielectric films of the preformed stacks.

In accordance with some embodiments of the present disclosure, in each of the preformed stacks, the sacrificial film and the dielectric film have the same length.

In accordance with some embodiments of the present disclosure, a method for manufacturing a semiconductor device includes: forming a stack assembly over a semiconductor substrate, the stack assembly including a plurality of dielectric layers and a plurality of sacrificial layers which are disposed to alternate with the dielectric layers; patterning the stack assembly such that the patterned stack assembly has a main structure and a staircase structure; forming an intermetal dielectric (IMD) layer over the staircase structure; forming a plurality of trenches in the patterned stack assembly and the IMD layer so as to form a plurality of preformed stack units each including a portion of the IMD layer, a portion of the staircase structure and a portion of the main structure; forming a plurality of separators in each of the trenches such that each of the separators is disposed to bridge two adjacent ones of the preformed stack units and such that two adjacent ones of the separators are spaced apart from each other to form a plurality of openings among the separators; replacing remaining portions of the sacrificial layers with conductive films through the openings, respectively; and forming a plurality of repeating units in the openings, respectively.

In accordance with some embodiments of the present disclosure, an uppermost one of the dielectric layers is disposed over all of the sacrificial layers.

In accordance with some embodiments of the present disclosure, in the patterned stack assembly, the uppermost one of the dielectric layers is patterned to have a dimension smaller than those of the sacrificial layers and those of the remaining ones of the dielectric layers. Each of the sacrificial layers and the remaining ones of the dielectric layers has a first portion disposed beneath the uppermost one of the dielectric layers. The uppermost one of the dielectric layers, the first portions of the sacrificial layers, and the first portions of the remaining ones of the dielectric layers together constitute the main structure of the patterned stack assembly.

In accordance with some embodiments of the present disclosure, in the patterned stack assembly, a distal one of the sacrificial layers has a dimension smaller than that of a proximate one of the sacrificial layers relative to the semiconductor substrate, and a distal one of the dielectric layers has a dimension smaller than that of a proximate one of the dielectric layers relative to the semiconductor substrate. Each of the sacrificial layers and the remaining ones of the dielectric layers has a second portion which extends beyond the uppermost one of the dielectric layers. The second portions of the sacrificial layers and the second portions of the remaining ones of the dielectric layers together constitute the staircase structure.

In accordance with some embodiments of the present disclosure, the dielectric layers are made of a first dielectric material, and the sacrificial layers are made of a second dielectric material different from the first dielectric material.

In accordance with some embodiments of the present disclosure, each of the repeating units is formed by sequentially forming a memory film and a channel film in a corresponding one of the openings, filling the corresponding opening with an isolation such that the isolation is surrounded by the channel film, patterning the isolation to form two holes which are separated from each other, and forming two conductive pillars in the two holes, respectively, such that the conductive pillars are separated from each other through a remaining region of the isolation.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming two preformed stack units over a semiconductor substrate, the two preformed stack units being spaced apart from each other by a trench, each of the two preformed stack units including at least one preformed stack and an upper film which is stacked on the at least one preformed stack, and which is made of a dielectric material, the at least one preformed stack including a dielectric film and a sacrificial film which are stacked on each other such that the sacrificial film is disposed between the upper film and the dielectric film;
    forming a plurality of separators in the trench, each of the separators bridging the two preformed stack units, two adjacent ones of the separators being spaced apart from each other so as to form a plurality of openings among the separators;

performing a replacement process to replace the sacrificial film of each of the two preformed stack units with a conductive film through the openings; and after the replacement process, forming a plurality of repeating units in the openings, respectively, each of the repeating units including
- a channel film which is made of a semiconductor material,
- a memory film which is disposed between the channel film and the conductive film, and
- a bit line and a source line which are spaced apart from each other, wherein the sacrificial film has an upper surface, a lower surface, and two side surfaces each interconnecting the upper surface and the lower surface, and wherein before the replacement process, a semiconductor material layer is not formed over each of the upper surface, the lower surface and the two side surfaces of the sacrificial film.

2. The method of claim 1, wherein each of the repeating units is formed by
forming the memory film and the channel film in a corresponding one of the openings such that the channel film is separated from the conductive film through the memory film, and
forming the bit line and the source line in the corresponding one of the openings such that the bit line and the source line are surrounded by the channel film and separated from each other by an isolation region.

3. The method of claim 2, wherein the bit line and the source line are formed by
filling an isolation part in the corresponding one of the openings such that the isolation part is surrounded by the channel film,
patterning the isolation part to form two holes which are separated from each other, and
filling a conductive material in the two holes so as to permit the bit line and the source line to be respectively formed in the two holes and so as to permit a remaining region of the isolation part to serve as the isolation region.

4. The method of claim 1, wherein the at least one preformed stack includes a plurality of preformed stacks, a distal one of the preformed stacks having a length shorter than a length of a proximate one of the preformed stacks relative to the semiconductor substrate, the sacrificial films of the preformed stacks being disposed to alternate with the dielectric films of the preformed stacks.

5. The method of claim 4, wherein, in each of the preformed stacks, the sacrificial film and the dielectric film have the same length.

6. The method of claim 4, wherein each of the preformed stack units further includes an inter-metal dielectric (IMD) part formed on the preformed stacks.

7. The method of claim 6, wherein in each of the preformed stack units, an upper surface of the IMD part, which is opposite to the semiconductor substrate, is flush with an upper surface of the upper film.

8. A method for manufacturing a semiconductor device, comprising:
forming a stack assembly over a semiconductor substrate, the stack assembly including a plurality of dielectric layers and a plurality of sacrificial layers which are disposed to alternate with the dielectric layers;
patterning the stack assembly such that the patterned stack assembly has a main structure and a staircase structure;
forming an inter-metal dielectric (IMD) layer over the staircase structure;
forming a plurality of trenches in the patterned stack assembly and the IMD layer so as to form a plurality of preformed stack units each including a portion of the IMD layer, a portion of the staircase structure and a portion of the main structure;
forming a plurality of separators in each of the trenches such that each of the separators is disposed to bridge two adjacent ones of the preformed stack units and such that two adjacent ones of the separators are spaced apart from each other to form a plurality of openings among the separators;
performing a replacement process to replace remaining portions of the sacrificial layers with conductive films through the openings, respectively; and
after the replacement process, forming a plurality of repeating units in the openings, respectively, each of the repeating units including
- a channel film which is made of a semiconductor material,
- a memory film which is disposed to separate the channel film from the conductive films, and
- a bit line and a source line which are spaced apart from each other, each of the bit line and the source line extending lengthwise along a direction normal to the semiconductor substrate, wherein the sacrificial film has an upper surface, a lower surface, and two side surfaces each interconnecting the upper surface and the lower surface, wherein, before the replacement process, the memory film is not formed over one of the two side surfaces of the sacrificial film, and wherein, after the replacement process, and after the memory film of each of the repeating units is formed, the memory film interfaces the conductive film which is positioned in place of the sacrificial film.

9. The method of claim 8, wherein an uppermost one of the dielectric layers is disposed over all of the sacrificial layers.

10. The method of claim 9, wherein
in the patterned stack assembly, the uppermost one of the dielectric layers is patterned to have a dimension smaller than a dimension of each of the sacrificial layers and a dimension of each of remaining ones of the dielectric layers,
each of the sacrificial layers and the remaining ones of the dielectric layers has a first portion disposed beneath the uppermost one of the dielectric layers, and
the uppermost one of the dielectric layers, the first portions of the sacrificial layers, and the first portions of the remaining ones of the dielectric layers together constitute the main structure of the patterned stack assembly.

11. The method of claim 10, wherein
in the patterned stack assembly, a distal one of the sacrificial layers has a dimension smaller than a dimension of a proximate one of the sacrificial layers relative to the semiconductor substrate, and a distal one of the dielectric layers has a dimension smaller than a dimension of a proximate one of the dielectric layers relative to the semiconductor substrate,
each of the sacrificial layers and the remaining ones of the dielectric layers has a second portion which extends beyond the uppermost one of the dielectric layers, and the second portions of the sacrificial layers and the second portions of the remaining ones of the dielectric layers together constitute the staircase structure.

12. The method of claim 8, wherein the dielectric layers are made of a first dielectric material, and the sacrificial layers are made of a second dielectric material different from the first dielectric material.

13. The method of claim 8, wherein each of the repeating units is formed by
   sequentially forming the memory film and the channel film in a corresponding one of the openings,
   filling the corresponding one of the openings with an isolation part such that the isolation part is surrounded by the channel film,
   patterning the isolation part to form two holes which are separated from each other, and
   forming the bit line and the source line in the two holes, respectively, such that the bit line and the source line are separated from each other through a remaining region of the isolation part.

14. The method of claim 12, wherein each of the separators is made of a third dielectric material which is different from each of the first dielectric material and the second dielectric material.

15. A method for manufacturing a semiconductor device, comprising:
   forming a first preformed stack unit and a second preformed stack unit over a semiconductor substrate, the first preformed stack unit and the second preformed stack unit being spaced apart from each other by a first trench, each of the first preformed stack unit and the second preformed stack unit including a sacrificial film and a dielectric film which are stacked on each other and which are respectively made of a first material and a second material, the first material being different from the second material;
   forming a plurality of first separators in the first trench, each of the first separators bridging the first preformed stack unit and the second preformed stack unit, two adjacent ones of the first separators being spaced apart from each other so as to form a plurality of first openings among the first separators, each of the first separators being made of a third material that is different from each of the first material and the second material;
   after formation of the first separators, performing a replacement process through the first openings to replace the sacrificial film of the first preformed stack unit with a first conductive film and to replace the sacrificial film of the second preformed stack unit with a second conductive film; and
   after the replacement process, forming a plurality of first repeating units respectively in the first openings, each of the first repeating units including
      a first channel film which is made of a semiconductor material,
      a first memory film which is disposed to separate the first channel film from each of the first conductive film and the second conductive film, and
      two first conductive pillars which are separated from each other by an isolation region and which respectively serve as a bit line and a source line,
   wherein the sacrificial film has an upper surface, a lower surface, and two side surfaces each interconnecting the upper surface and the lower surface, and
   wherein, before the replacement process, each of the two first conductive pillars and the first memory film is not formed over one of the upper surface, the lower surface and the two side surfaces of the sacrificial film.

16. The method of claim 15, wherein
each of the first repeating units including
   a first inner portion which includes the two first conductive pillars that are separated from each other, and
   a first outer portion which surrounds the first inner portion so as to separate the first inner portion from each of the first conductive film, the second conductive film and two adjacent ones of the first separators, the first outer portion including the first memory film and the first channel film which is disposed between the first memory film and the first inner portion.

17. The method of claim 15, further comprising:
   forming a third preformed stack unit over the semiconductor substrate, the second preformed stack unit and the third preformed stack unit being spaced apart from each other by a second trench, the third performed stack unit including a sacrificial film and a dielectric film which are stacked on each other, and which are respectively made of the first material and the second material;
   forming a plurality of second separators in the second trench, each of the second separators bridging the second preformed stack unit and the third preformed stack unit, two adjacent ones of the second separators being spaced apart from each other so as to form a plurality of second openings among the second separators, each of the second separators being made of the third material, the second separators being staggered from the first separators, respectively;
   replacing the sacrificial film of the third preformed stack unit with a third conductive film through the second openings; and
   forming a plurality of second repeating units respectively in the second openings.

18. The method of claim 15, further comprising:
   forming a third preformed stack unit over the semiconductor substrate, the second preformed stack unit and the third preformed stack unit being spaced apart from each other by a second trench, the third performed stack unit including a sacrificial film and a dielectric film which are stacked on each other, and which are respectively made of the first material and the second material;
   forming a plurality of second separators in the second trench, each of the second separators bridging the second preformed stack unit and the third preformed stack unit, two adjacent ones of the second separators being spaced apart from each other so as to form a plurality of second openings among the second separators, each of the second separators being made of the third material, the second separators being in alignment with the first separators, respectively;
   replacing the sacrificial film of the third preformed stack unit with a third conductive film through the second openings; and
   forming a plurality of second repeating units respectively in the second openings.

19. The method of claim 18, wherein
each of the second repeating units including
   a second inner portion which includes two second conductive pillars that are separated from each other, and
   a second outer portion which surrounds the second inner portion so as to separate the second inner portion from each of the second conductive film, the third conductive film and two adjacent ones of the second separators, the second outer portion including a second memory film and a second channel film which is disposed between the second memory film and the second inner portion, and the two first conductive pillars of each of the first repeating units are in alignment with the two second conductive pillars of each of the second repeating units, respectively.

20. The method of claim 18, wherein the sacrificial film of the third preformed stack unit is replaced with the third conductive film before formation of the second repeating units.

* * * * *